United States Patent
Pendse

(10) Patent No.: US 12,396,305 B2
(45) Date of Patent: Aug. 19, 2025

(54) SEMICONDUCTOR RECONSTITUTION

(71) Applicant: Meta Platforms Technologies, LLC, Menlo Park, CA (US)

(72) Inventor: Rajendra D. Pendse, Fremont, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 488 days.

(21) Appl. No.: 17/229,081

(22) Filed: Apr. 13, 2021

(65) Prior Publication Data

US 2022/0328740 A1 Oct. 13, 2022

(51) Int. Cl.
*H10H 20/857* (2025.01)
*H01L 25/075* (2006.01)
*H10H 20/01* (2025.01)
*H10H 20/852* (2025.01)

(52) U.S. Cl.
CPC ....... *H10H 20/857* (2025.01); *H01L 25/0753* (2013.01); *H10H 20/852* (2025.01); *H10H 20/0362* (2025.01); *H10H 20/0364* (2025.01)

(58) Field of Classification Search
CPC ............... H10H 20/857; H10H 20/852; H10H 20/0362; H10H 20/0364; H01L 25/0753
See application file for complete search history.

(56) References Cited

U.S. PATENT DOCUMENTS

| | | | | |
|---|---|---|---|---|
| 2009/0243045 A1* | 10/2009 | Pagaila | .................... | H01L 24/12 257/E21.268 |
| 2011/0068427 A1* | 3/2011 | Paek | ........................ | H01L 24/20 257/E21.705 |
| 2012/0074581 A1 | 3/2012 | Guzek et al. | | |
| 2012/0280403 A1 | 11/2012 | Pagaila et al. | | |
| 2016/0358889 A1* | 12/2016 | Lai | .......................... | H01L 21/768 |
| 2019/0096864 A1* | 3/2019 | Huitema | .................. | H01L 24/24 |
| 2019/0346680 A1* | 11/2019 | Ahmed | .................. | H01L 27/156 |

OTHER PUBLICATIONS

Invitation to Pay Additional Fees, Partial Search Result, and Provisional Opinion Accompanying the Partial Search Result for International Application PCT/US2022/023221, mailed Jul. 28, 2022, 16 pages.
International Search Report and Written Opinion for International Application No. PCT/US2022/023221, mailed Sep. 19, 2022, 22 pages.

* cited by examiner

*Primary Examiner* — Changhyun Yi
(74) *Attorney, Agent, or Firm* — Morgan, Lewis & Bockius LLP

(57) ABSTRACT

An article including a semiconductor die including integrated circuitry is described. The semiconductor die defines a first major surface, a second major surface opposite the first major surface, and a plurality of perimeter walls joining the first major surface and the second major surface. The article further includes at least one through silicon via extending through the semiconductor die between the first major surface and the second major surface and a fill material surrounding at least part of the semiconductor die. The fill material contacts at least one of the plurality of perimeter walls, and a surface of the fill material is substantially co-planar with the first major surface of the semiconductor die. The article further includes at least one redistribution layer on the first major surface of the semiconductor die and the surface of the fill material.

12 Claims, 20 Drawing Sheets

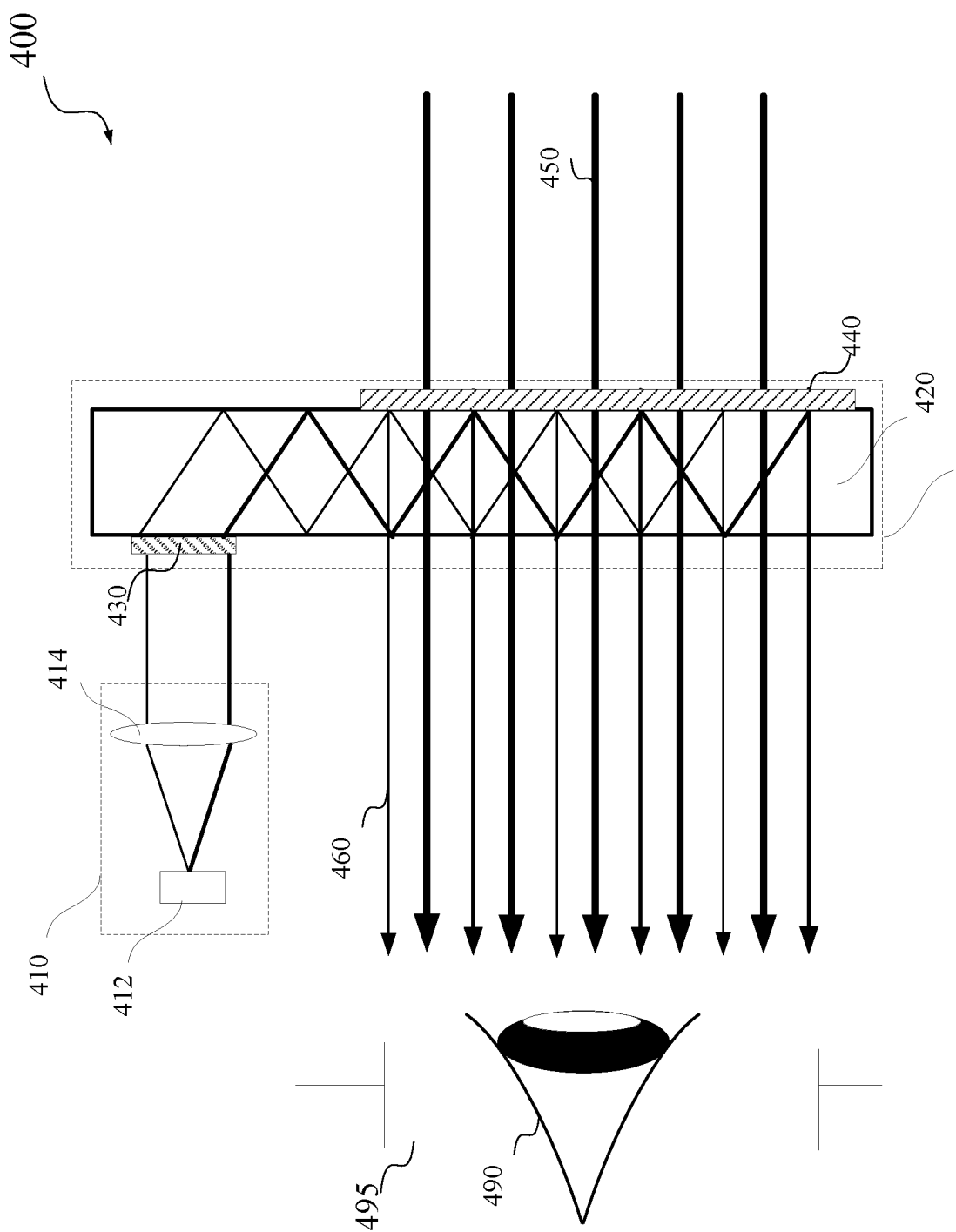

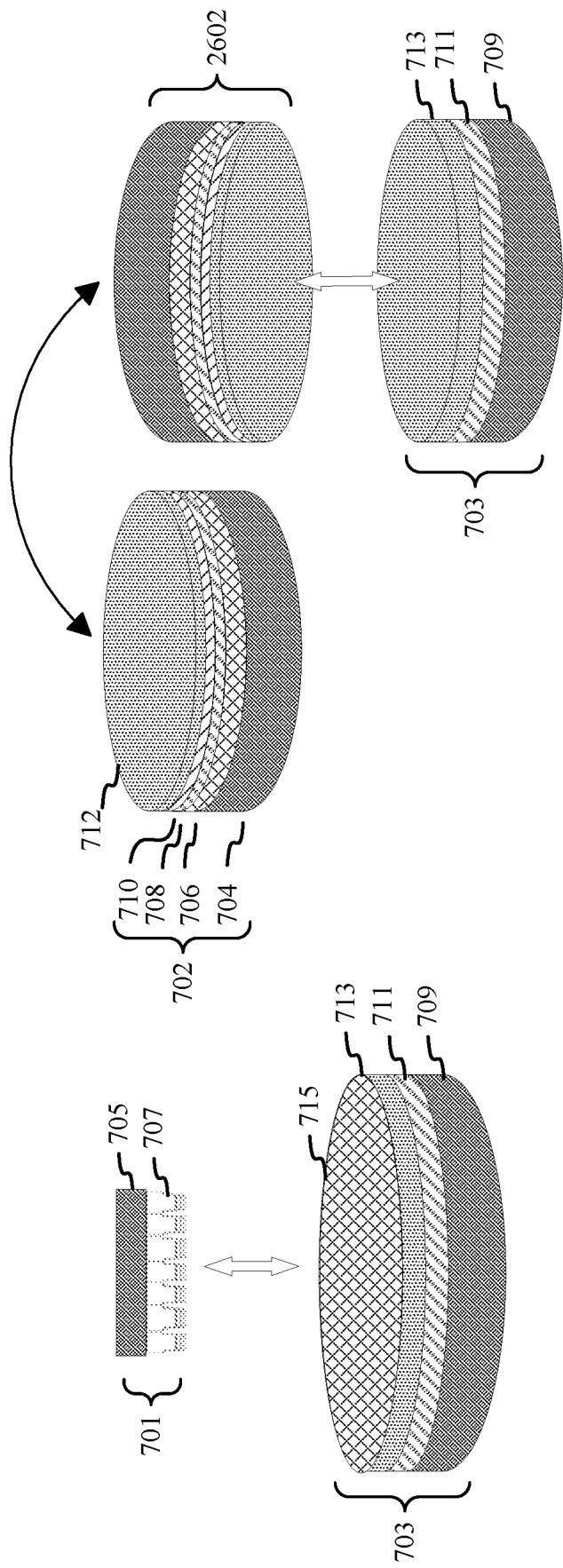

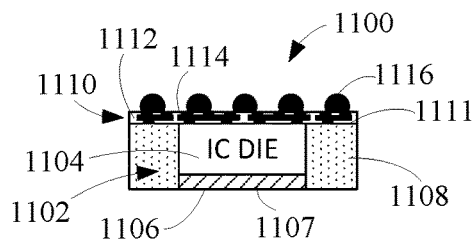
FIG. 11A
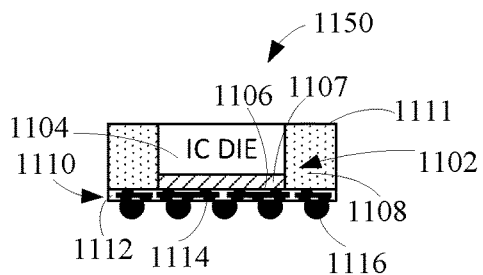
FIG. 11B
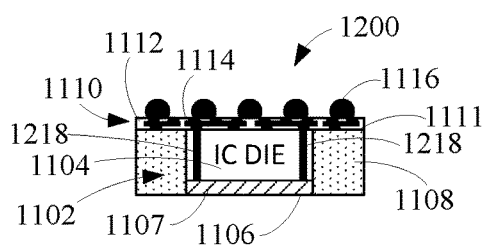
FIG. 12A
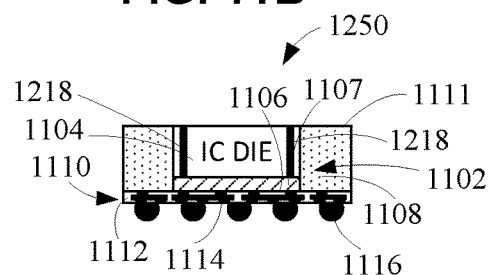
FIG. 12B
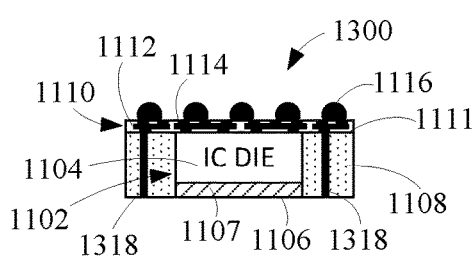
FIG. 13A
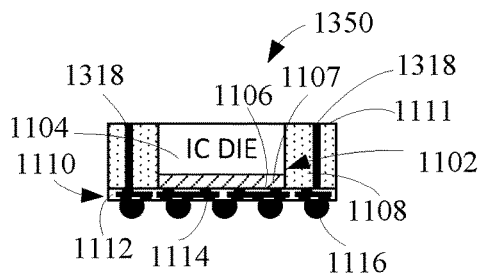
FIG. 13B
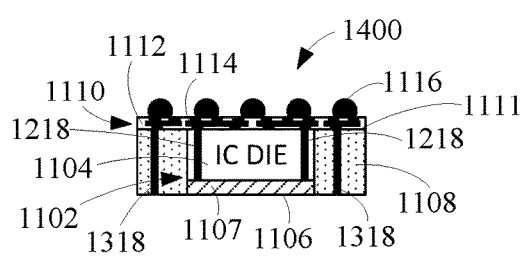
FIG. 14A
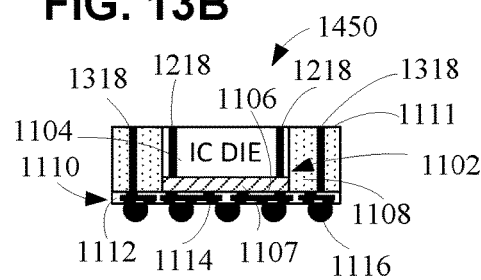
FIG. 14B
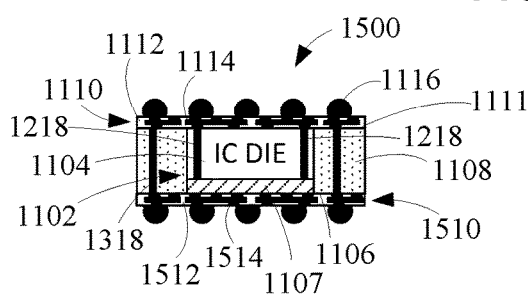
FIG. 15
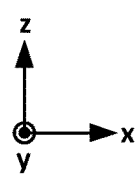

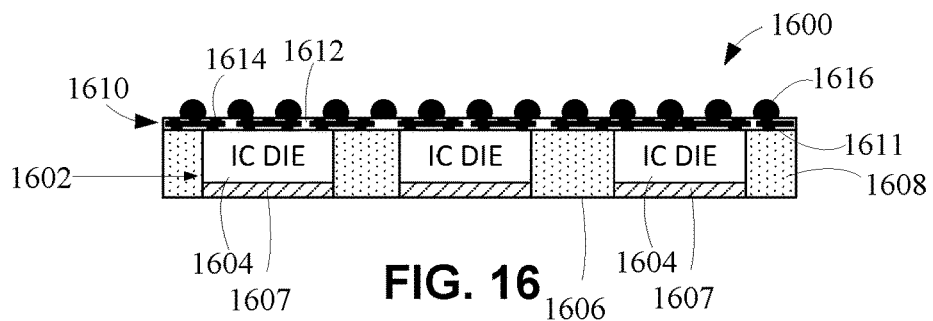
FIG. 16
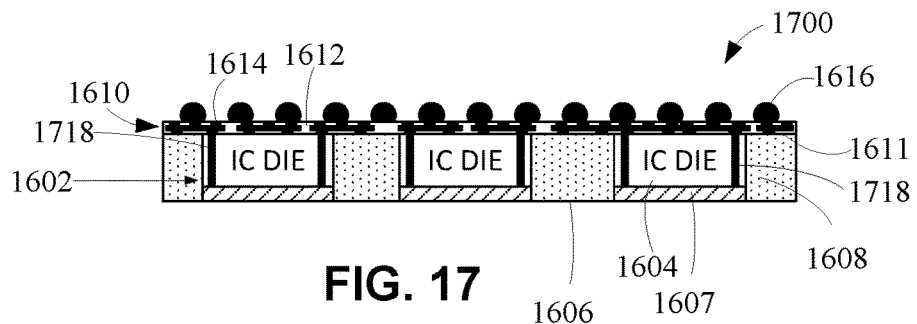
FIG. 17
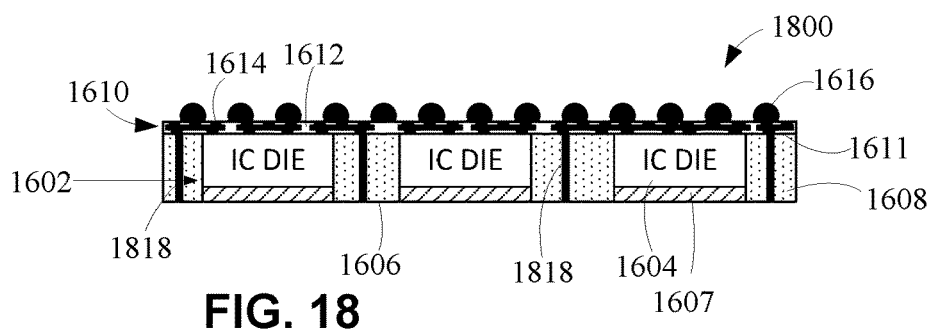
FIG. 18
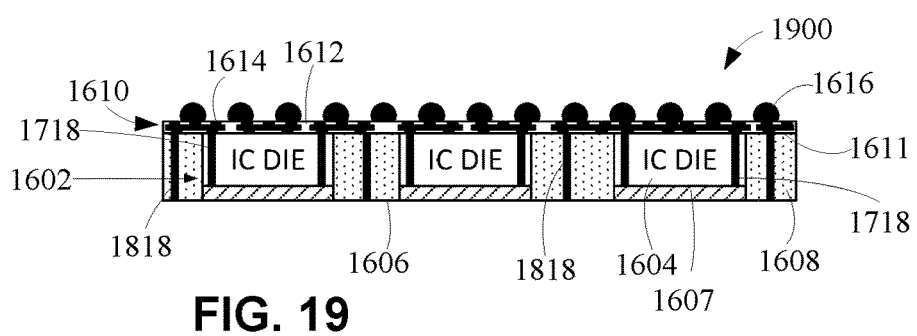
FIG. 19
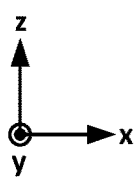
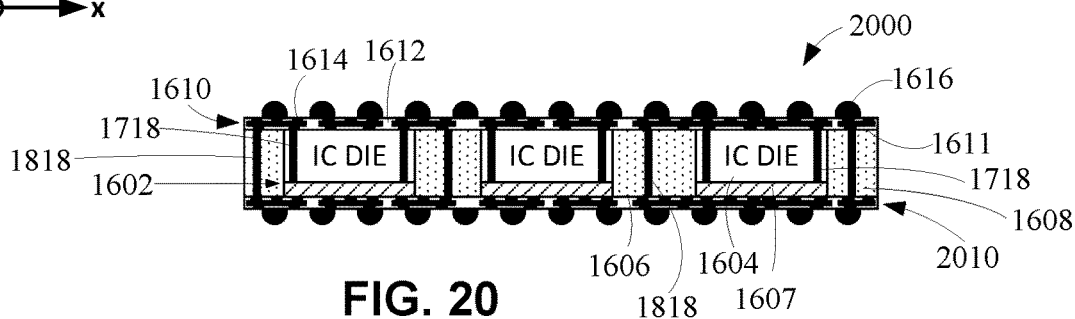
FIG. 20

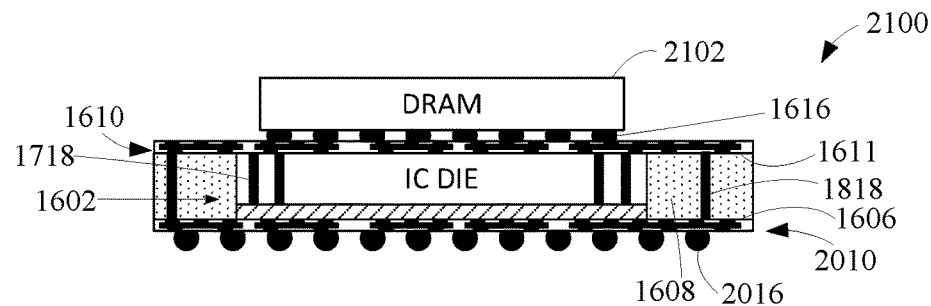
FIG. 21
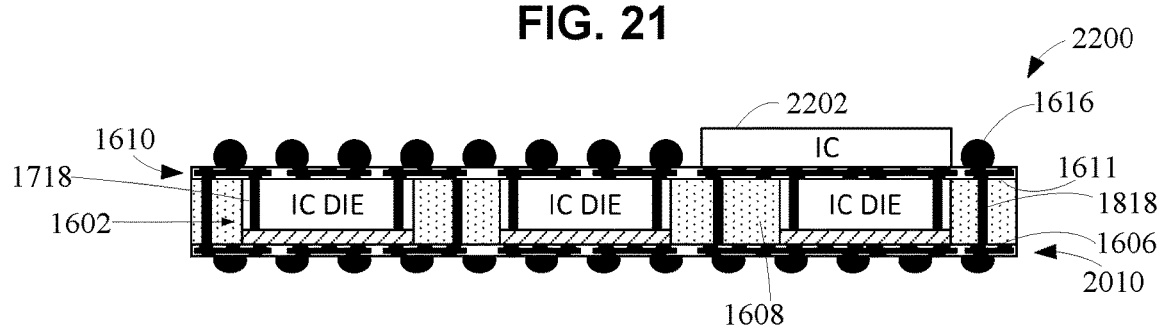
FIG. 22
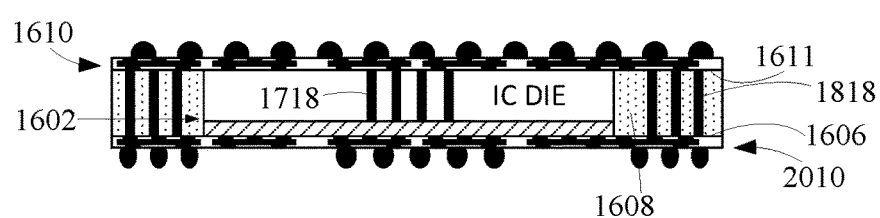
FIG. 23
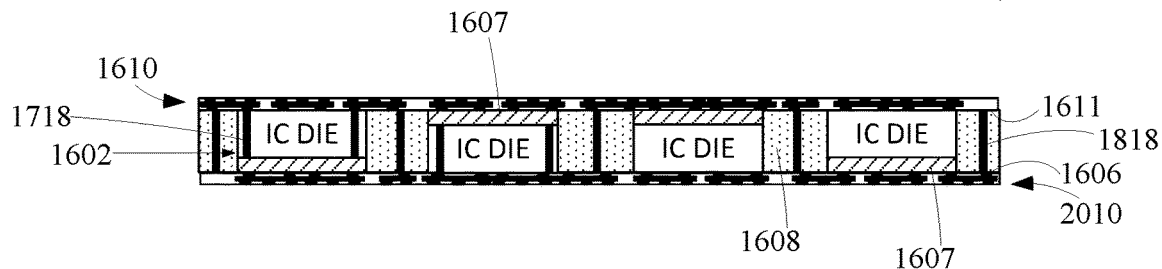
FIG. 24
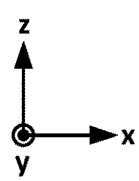

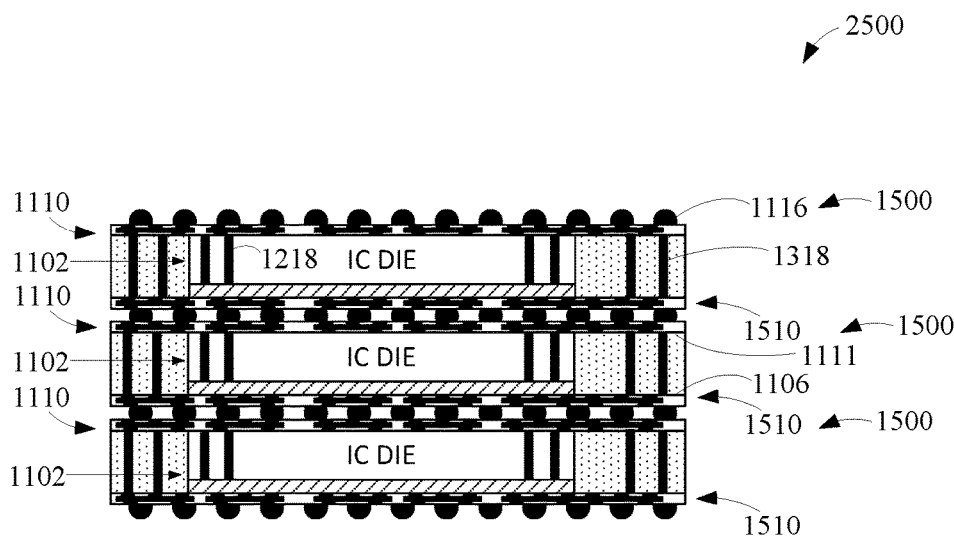
FIG. 25
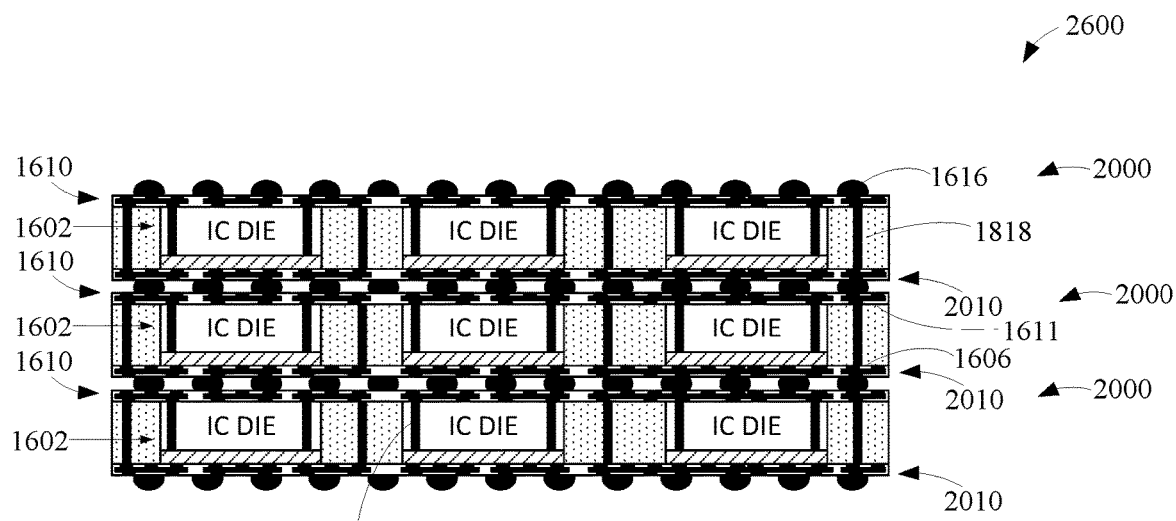
FIG. 26
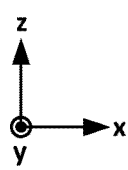

SEMICONDUCTOR RECONSTITUTION

TECHNICAL FIELD

This disclosure generally relates to semiconductor devices and semiconductor processing.

BACKGROUND

Optical devices, such as optical displays, present content to a user. For example, an optical display emits light and typically spatially and temporally modulates the light to form images and/or video. In some applications, the display emits spatially uniform light from one or more light sources and modulates the light using a spatial filter, such as a liquid crystal (LC) panel. In other applications, light sources of the optical display may be arranged in a 2D array and spatially modulate the light by virtue of emitting a range of brightnesses. Some light sources may incorporate different substrate materials for drive circuitry and light emission devices to achieve different optical characteristics.

An integrated circuit (IC) or monolithic integrated circuit (also referred to as an IC, a chip, a microchip) is a set of electronic circuits on one small flat piece of semiconductor material that is normally silicon. A die, in the context of integrated circuits, is a small block of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing at least one circuitry or one copy of a circuit. Each of these pieces is called a die or IC die. A multi-chip module (MCM) is generically an electronic assembly (such as a package with a number of conductor terminals or "pins") where multiple integrated circuits (ICs or "chips"), semiconductor dies and/or other discrete components are integrated, usually onto a unifying substrate, so that in use it can be treated as if it were a larger IC. The individual ICs that make up an MCM are known as chiplets.

SUMMARY

In general, the present disclosure describes semiconductor wafer manufacturing methods, systems and articles for forming an electronic assembly comprising one or more ICs (or dies, chip modules, chips, chiplets, etc.). The techniques include reconstituting one or more semiconductor dies with a fill material that at least partially encapsulates one or more of the one or more semiconductor dies, and forming one or more redistribution layers (RDLs) on a surface of the semiconductor dies and the fill material. In some examples, through silicon vias (TSVs) may be formed in the one or more semiconductor dies, one or more through package vias (TPVs) may be formed in the fill material, and the redistribution layer(s) may extend onto a surface of the one or more semiconductor dies and a surface of the fill material, where the surface of the fill material may be co-planar with the surface(s) of the semiconductor dies. The RDLs may provide a plurality of interconnection points and interconnection paths among the planar positions, e.g., between positions of the semiconductor die surface(s) and the co-planar fill material surface. In some examples, the fill material provides an increased surface area for an increased RDL area, and correspondingly enabling an increase in the number of interconnection points and/or paths or a decrease in the density of interconnections points and/or paths, e.g., which may decrease adverse electrical artifacts, cross-talk, undesirable inductance, and the like. In some examples, the fill material may provide an increased volume for an increase in vias, e.g., interconnection points and/or paths through the thickness of the fill material and/or semiconductor die(s) between different planes.

In one example, this disclosure describes an article that includes a semiconductor die including integrated circuitry, wherein the semiconductor die defines a first major surface, a second major surface opposite the first major surface, and a plurality of perimeter walls joining the first major surface and the second major surface; at least one through silicon via extending through the semiconductor die between the first major surface and the second major surface; a fill material surrounding at least part of the semiconductor die, wherein the fill material contacts at least one of the plurality of perimeter walls, and wherein a surface of the fill material is substantially co-planar with the first major surface of the semiconductor die; and at least one redistribution layer on the first major surface of the semiconductor die and the surface of the fill material.

In another example, this disclosure describes a method that includes placing a plurality of semiconductor dice on a carrier wafer; introducing a fill material between the plurality of semiconductor dice to at least partially encapsulate the plurality of semiconductor dice; forming at least one through silicon via extending through at least one of the plurality of semiconductor dice between the first major surface and a second major surface opposite the first major surface; and forming at least one redistribution layer on a first major surface of the plurality of semiconductor dice, wherein the at least one redistribution layer extends onto a surface of the fill material.

In another example, this disclosure describes a method that includes placing a semiconductor die on a carrier wafer; introducing a fill material surrounding at least part of the semiconductor die to at least partially encapsulate the semiconductor die; thinning fill material and the semiconductor die such that a surface of the fill material is substantially co-planar with a first major surface of the semiconductor die; forming at least one through silicon via extending through at least one of the first or second semiconductor dice between the first major surface and the second major surface; and forming at least one redistribution layer on the first major surface of the semiconductor die and the surface of the fill material.

In another example, this disclosure describes an artificial reality system including a display including: a microLED array comprising a plurality of microLEDs and a semiconductor die including integrated circuitry, wherein the microLED array defines a first major surface, a second major surface opposite the first major surface, and a plurality of perimeter walls joining the first major surface and the second major surface; a fill material surrounding at least part of the microLED array, wherein the fill material contacts at least one of the plurality of perimeter walls, and wherein a surface of the fill material is substantially co-planar with the first major surface of the microLED array; and at least one redistribution layer on the second major surface of the microLED array and the surface of the fill material; and a semiconductor die on a major surface of the at least one redistribution layer opposite the second major surface of the microLED array and the surface of the fill material.

Thus, the disclosed examples provide methods and techniques for forming an electronic assembly comprising one or more ICs. The details of one or more examples are set forth in the accompanying drawings and the description below.

Other features, objects, and advantages will be apparent from the description, drawings, and claims.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 3 illustrates an example of an optical see-through augmented reality system including a waveguide display, in accordance with the techniques described in this disclosure.

FIG. 7A illustrates an example of a method of die-to-wafer bonding for arrays of LEDs according to certain embodiments.

FIG. 7B illustrates an example of a method of wafer-to-wafer bonding for arrays of LEDs according to certain embodiments.

FIG. 11A is a schematic illustration of a cross-section of an example article, in accordance with the techniques described in this disclosure.

FIG. 11B is a schematic illustration of a cross-section of another example article, in accordance with the techniques described in this disclosure.

FIG. 12A is a schematic illustration of a cross-section of another example article, in accordance with the techniques described in this disclosure.

FIG. 12B is a schematic illustration of a cross-section of another example article, in accordance with the techniques described in this disclosure.

FIG. 13A is a schematic illustration of a cross-section of another example article, in accordance with the techniques described in this disclosure.

FIG. 13B is a schematic illustration of a cross-section of another example article, in accordance with the techniques described in this disclosure.

FIG. 14A is a schematic illustration of a cross-section of another example article, in accordance with the techniques described in this disclosure.

FIG. 14B is a schematic illustration of a cross-section of another example article, in accordance with the techniques described in this disclosure.

FIG. 15 is a schematic illustration of a cross-section of another example article, in accordance with the techniques described in this disclosure.

FIG. 16 is a schematic illustration of a cross-section of another example article, in accordance with the techniques described in this disclosure.

FIG. 17 is a schematic illustration of a cross-section of another example article, in accordance with the techniques described in this disclosure.

FIG. 18 is a schematic illustration of a cross-section of another example article, in accordance with the techniques described in this disclosure.

FIG. 19 is a schematic illustration of a cross-section of another example article, in accordance with the techniques described in this disclosure.

FIG. 20 is a schematic illustration of a cross-section of another example article, in accordance with the techniques described in this disclosure.

FIG. 21 is a schematic illustration of a cross-section of another example article, in accordance with the techniques described in this disclosure.

FIG. 22 is a schematic illustration of a cross-section of another example article, in accordance with the techniques described in this disclosure.

FIG. 23 is a schematic illustration of a cross-section of another example article, in accordance with the techniques described in this disclosure.

FIG. 24 is a schematic illustration of a cross-section of another example article, in accordance with the techniques described in this disclosure.

FIG. 25 is a schematic illustration of a cross-section of another example article, in accordance with the techniques described in this disclosure.

FIG. 26 is a schematic illustration of a cross-section of another example article, in accordance with the techniques described in this disclosure.

Figure 1:
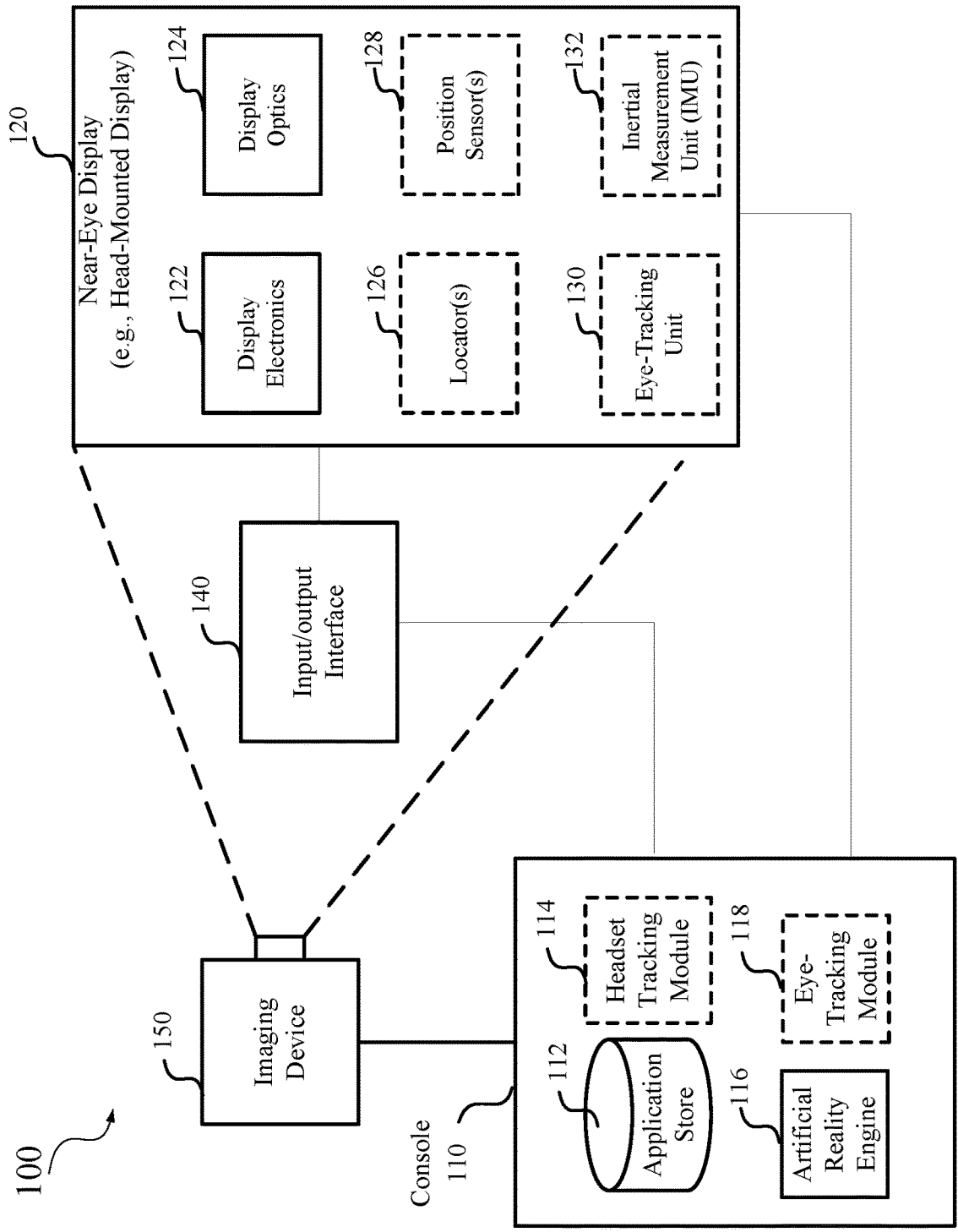
FIG. 1 is a simplified block diagram of an example of an artificial reality system environment including a near-eye display, in accordance with the techniques described in this disclosure.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to a unique way to integrate functional electronic blocks generally involving semiconductor components. In some examples, and without limitation, the present disclosure is directed to systems, methods and articles that integrate semiconductor components, chiplets, and/or micro light emitting diodes (µLEDs) with associated digital and/or analog circuitry, such as control or driver circuitry for the semiconductor components and/or µLEDs, in various configurations including extended areas which may include additional redistribution layer area and associated increased interconnections and interconnection pathways and/or decreased interconnection and interconnection pathway density. Various inventive embodiments are described herein, including devices, systems, methods, materials, and the like.

Modular approaches to building processors, memory, and other semiconductor components such as chiplets require a plurality input/output (I/O) access points and pathways in order to interconnect chiplet circuits and achieve the modular design. Current chiplets are constrained by the size of the chiplet in the area available for in-plane connections via redistribution layers (RDLs) and through-plane connections (e.g., between layers) by through silicon vias (TSVs) and/or through package vias (TPVs).

In some devices, for example, artificial reality devices (including virtual reality, augmented reality, and mixed reality), µLEDs and waveguides may be used to render artificial reality images. The µLEDs may be integrated with digital and analog circuitry in the form of one or more digital/analog die and may be integrated with other components, such as a graphics processor, in a miniaturized display package.

The integration of semiconductor components with each other and with digital/analog circuitry often requires wafer-level manufacturing operations such as formation of TSVs and/or TPVs in the wafers to facilitate the integration of the circuits in a semiconductor package. However, the area/volume available for interconnection points and pathways in conventional semiconductor components and chiplets made by conventional manufacturing operations is constrained. Consequently, I/O access to the semiconductor components is constrained by the limited area/volume and other interconnection routing density constraints such as the need to reduce, minimize, or otherwise control cross-talk between interconnection points/pathways, e.g., by coupling capacitance.

The present disclosure is directed to articles, systems, and techniques of forming semiconductor components with increased area available for in-plane (RDL) interconnection points and pathways and through-plane interconnection points and pathways (TSVs and TPVs). In some examples, articles with increased area for in-plane and through-plane interconnection points and pathways may be fabricated via semiconductor reconstitution techniques, e.g., dicing semiconductor dies from a semiconductor wafer, picking and placing the semiconductor dies on a carrier wafer, and processing the semiconductor dies using one or more processing steps not easily performed on semiconductor wafers, e.g., due to a mismatch in semiconductor wafer size and manufacturing equipment for the processing steps or other practical and/or cost reasons such as performing expensive processes only on diced semiconductor dies that pass certain testing requirements. Furthermore, in situations requiring integration of dissimilar semiconductor die together in a single modular unit, such integration is precluded by the traditional approach of processing on the parent wafer for any one of the semiconductor dies.

In some examples, disclosed semiconductor components, chiplets, and/or techniques may take advantage of areas of fill material by including RDL, TSV, and TPV connection paths along and/or through the fill material, thereby increasing the space (e.g., area or volume) available for interconnections and consequently the flexibility of designing, arranging, and utilizing modular semiconductor components and/or chiplets. Multiple semiconductor dies may be reconstituted on a common substrate, e.g., a carrier wafer, and may be interconnected via a combination of RDLs on one or both sides (e.g., alternatively referred to as top/bottom or front/back) and TSVs within each or a subset of the semiconductor die and/or TPVs within the fill material. Multi-chip integration via disclosed reconstitution processes utilize regions around die borders to increase the area for routing and I/O placement. The increased I/O area may ease routing density and may reduce cross-talk, or may increase I/O count for a given routing density.

In some examples, disclosed semiconductor components, chiplets, and/or techniques may enable double-sided (top/bottom) RDL formation, doubling the area available to form I/O interconnections from the semiconductor dies and allowing logical grouping of I/O interconnects by type, e.g., power/ground interconnects accessed via one side and signal interconnects accessed via the other side. Semiconductor components with double-sided RDLs may also enable formation of stackable units.

In some examples, disclosed processes include picking and placing a plurality of diced semiconductor dies face down on a carrier wafer with a thin layer of adhesive. The dies are then encapsulated with the fill material, thinned to a desired thickness to expose the backs of the dies, and planarized. TSVs may then be formed in the semiconductor dies and TPVs may be formed in the fill material. In some examples, TSV/TPV formation may be integrated with RDL formation for a streamlined process flow, e.g., the TSVs and/or TPVs may be grown during RDL layer formation.

In any of the examples described herein, disclosed processes and/or wafer reconstitution may decrease the cost, complexity, and/or processing time of integrating semiconductor components with digital and/or analog circuitry. In addition, reconstitution may preserve pre-processed material that would otherwise be thrown away, e.g., from a larger CMOS digital/analog circuitry wafer. Further, disclosed semiconductor components with increased area and associated fabrication techniques may provide increased counts of in-plane (RDL) interconnection points and pathways and through-plane (TSVs and TPVs) interconnection points and pathways, decreased in-plane and/or through-plane interconnection point and/or pathway density, and/or decreased cross-talk.

As mentioned above, in some implementations, the techniques described herein may be used to form devices that include micro-LEDs. The micro-LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "μLED" refers to an LED that has a chip where a linear dimension of the chip is less than about 200 μm, such as less than 100 μm, less than 50 μm, less than 20 μm, less than 10 μm, or smaller. For example, the linear dimension of a micro-LED may be as small as 6 μm, 5 μm, 4 μm, 2 μm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., bumps, pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback applications, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some examples, artificial reality system 100 may include one or more reconstituted semiconductor components such as described herein, e.g., display electronics 122 may include one or more reconstituted semiconductor components such as described herein. In some examples, one or more reconstituted semiconductor components such as described herein may comprise semiconductor components with increased area available for RDL, TSV, and/or TPV interconnection points and pathways, which may be integrated with circuitry, such as display driver circuitry, in a stacked configuration. For example, a μLED array may be stacked on the display driver circuitry, where the display driver circuitry which may include an integrated circuit including digital and analog circuitry for controlling the μLED array. This may facilitate packaging of the μLED and display driver circuitry in a relatively small volume and/or using an efficient, cost effective process. The stacked μLED and display driver circuitry may be formed using any of the techniques described herein.

Figure 2A:
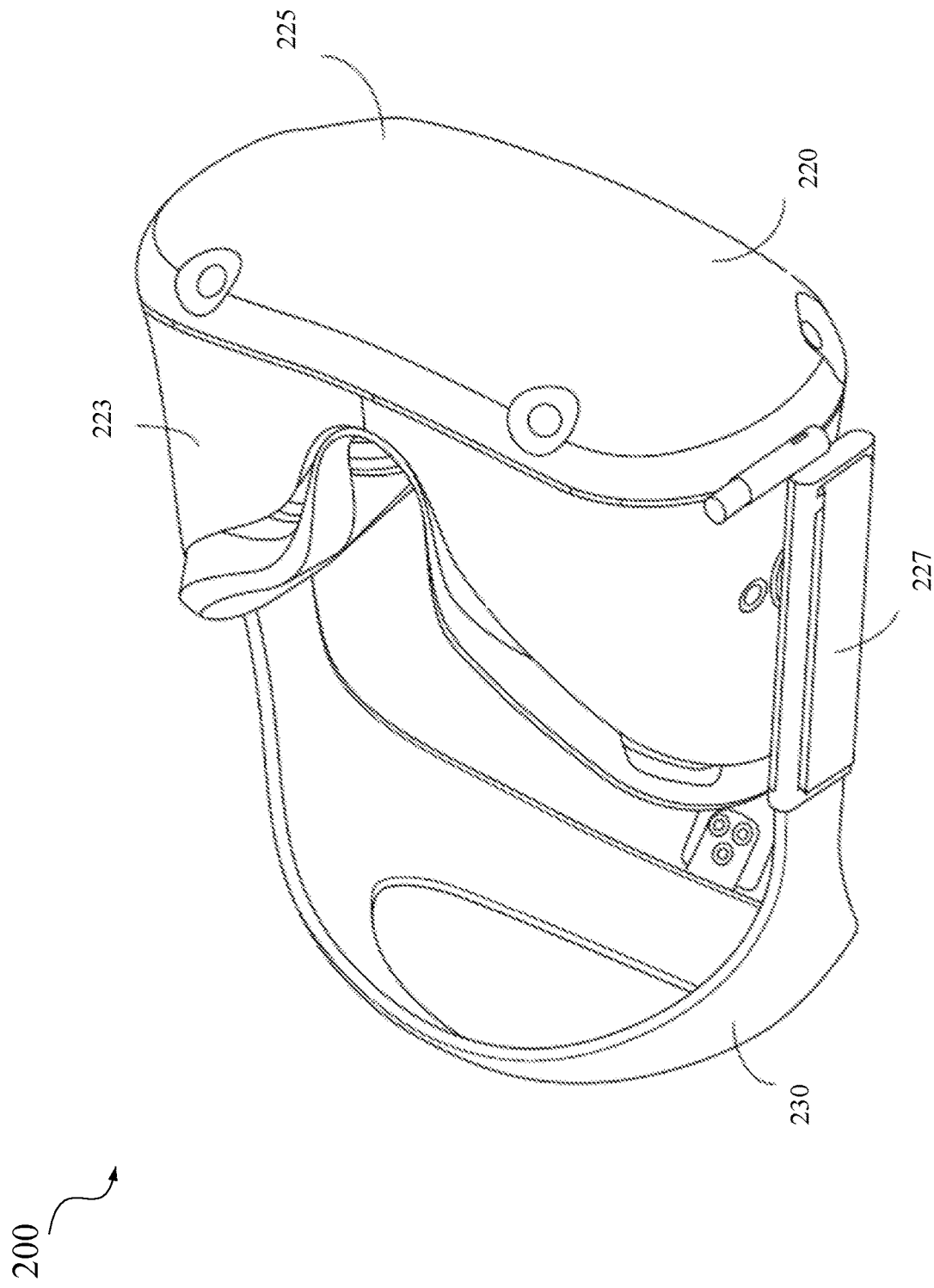
FIG. 2A is a perspective view of an example of a near-eye display in the form of a head-mounted display (HMD) device for implementing some of the examples disclosed herein.

FIG. 2A is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2A shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 2B below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

In some examples, HMD device 200 may include one or more reconstituted semiconductor components such as described herein.

Figure 2B:
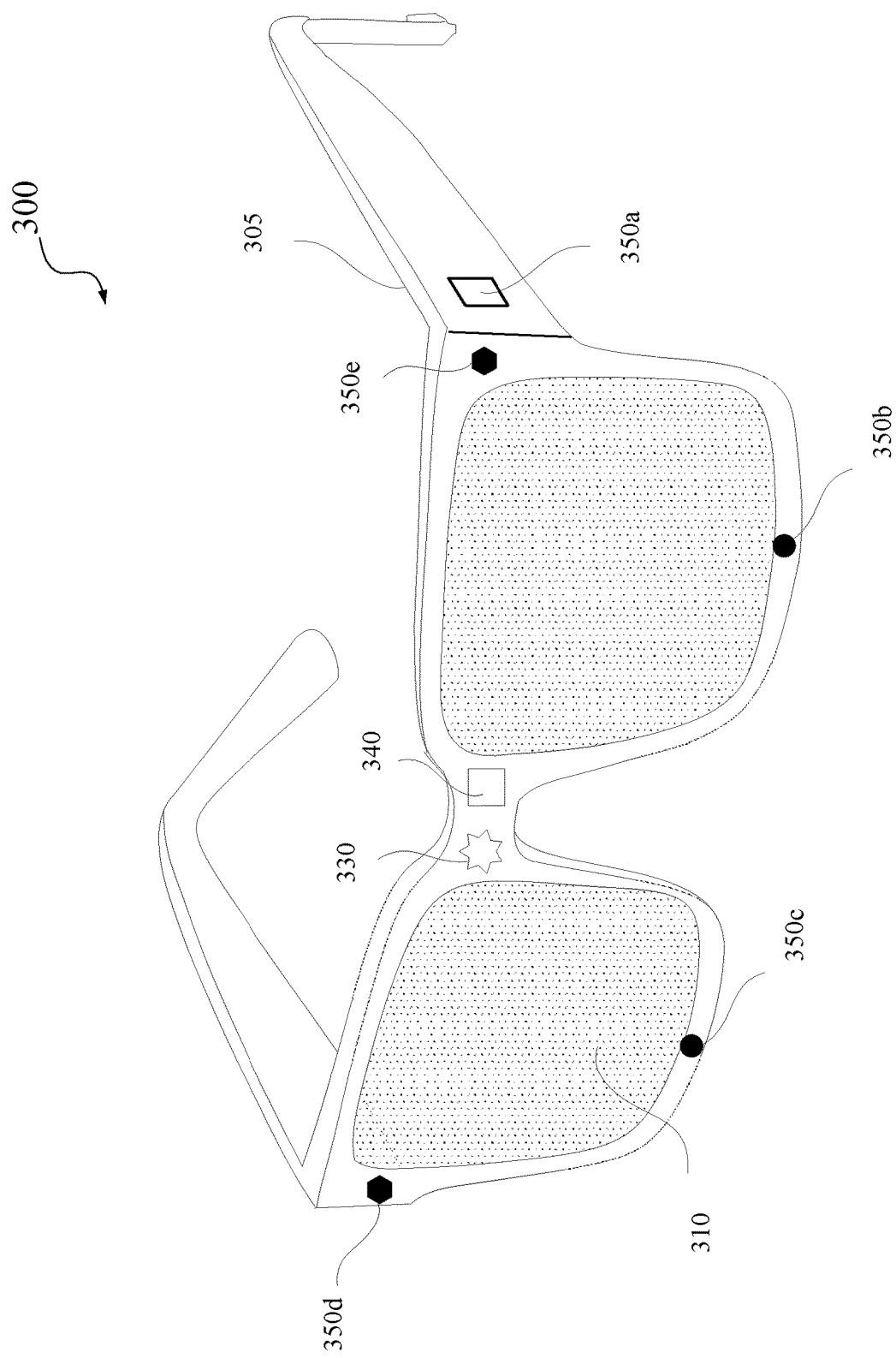
FIG. 2B is a perspective view of an example of a near-eye display in the form of a pair of glasses for implementing some of the examples disclosed herein.

FIG. 2B is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

In some examples, near-eye display 300 may include one or more reconstituted semiconductor components such as described herein.

FIG. 3 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 696 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

In some examples, augmented reality system 400 may include one or more reconstituted semiconductor components such as described herein, e.g., image source 412 may include one or more reconstituted semiconductor components such as described herein.

Figure 4B:
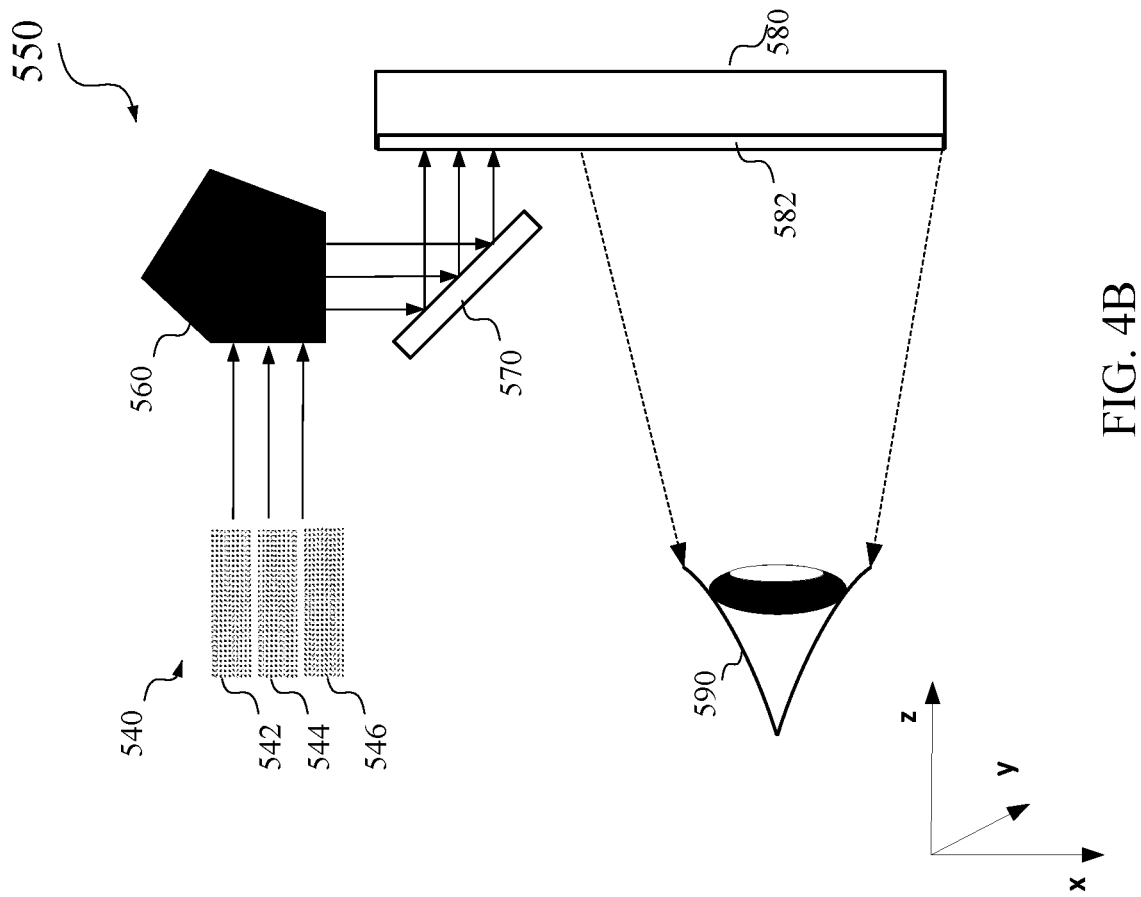
FIG. 4B illustrates an example of a near-eye display device including a waveguide display, in accordance with the techniques described in this disclosure.
Figure 4A:
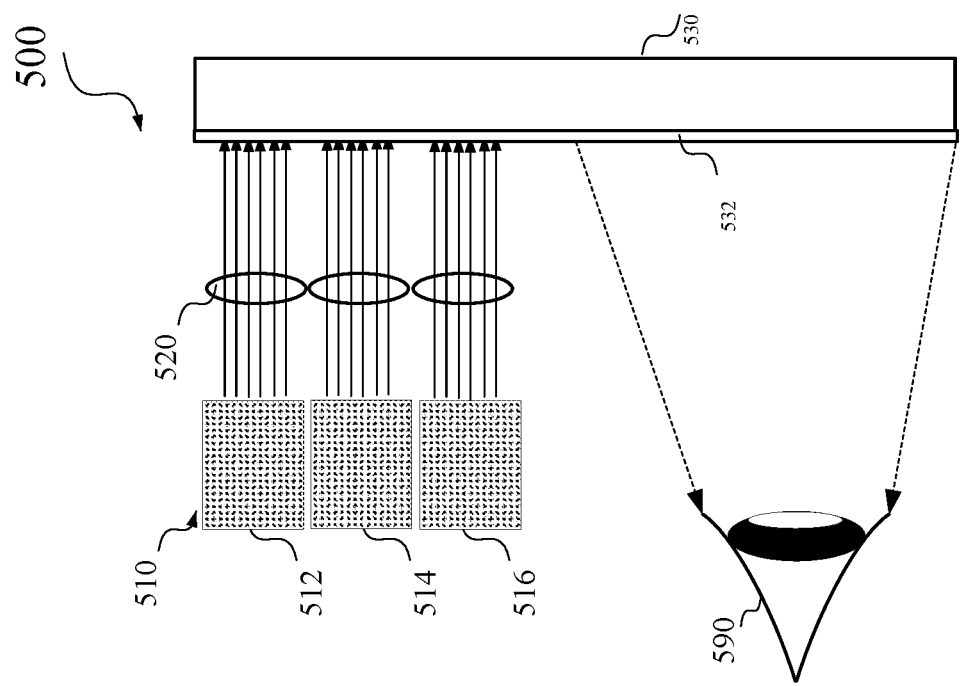
FIG. 4A illustrates an example of a near-eye display device including a waveguide display, in accordance with the techniques described in this disclosure.

FIG. 4A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 3. Coupler 532 may also couple portions of the light propagating within waveguide display 530 out of waveguide display 530 and towards user's eye 590.

In some examples, NED device 500 may include one or more reconstituted semiconductor components such as described herein, e.g., light source 510 may include one or more reconstituted semiconductor components such as described herein.

FIG. 4B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 3. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

In some examples, NED device 550 may include one or more reconstituted semiconductor components such as described herein, e.g., light source 540 may include one or more reconstituted semiconductor components such as described herein.

Figure 5:
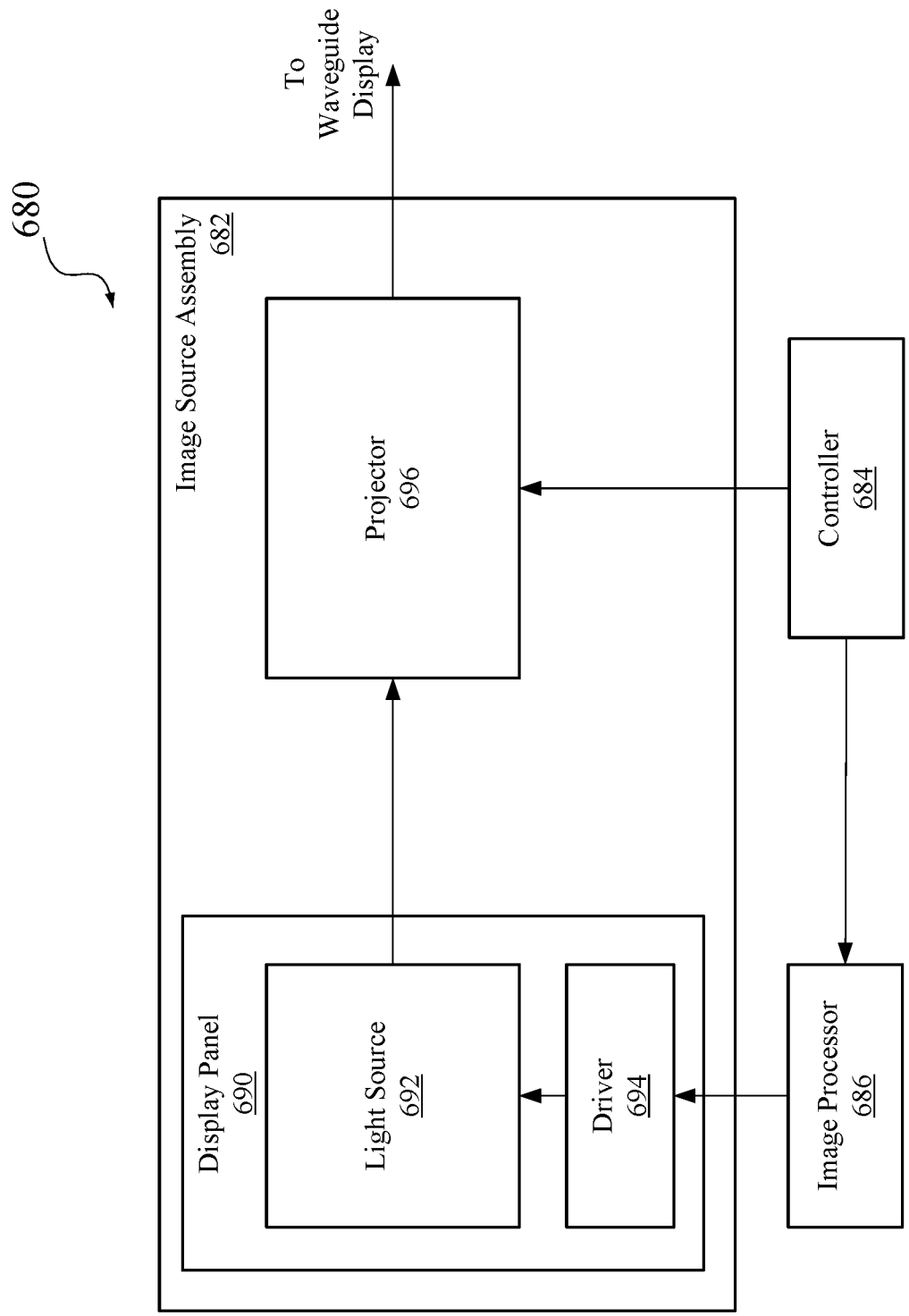
FIG. 5 illustrates an example of an image source assembly in an augmented reality system, in accordance with the techniques described in this disclosure.

FIG. 5 illustrates an example of an image source assembly 682 in a near-eye display system 680 according to certain embodiments. Image source assembly 682 may include, for example, a display panel 690 that may generate display images to be projected to the user's eyes, and a projector 696 that may project the display images generated by display panel 690 to a waveguide display as described above with respect to FIGS. 4-5B. Display panel 690 may include a light source 692 and a driver circuit 694 for light source 692. Light source 692 may include, for example, light source 510 or 540. Projector 696 may include, for example, freeform optical element 560, scanning mirror 570, and/or projection optics 520 described above. Near-eye display system 680 may also include a controller 684 that synchronously controls light source 692 and projector 696 (e.g., scanning mirror 570). Image source assembly 682 may generate and output an image light to a waveguide display (not shown in FIG. 5), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 692 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 680. In some embodiments, a display panel in accordance with an embodiment may use more than three primary colors. Each pixel in light source 692 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 684 may control the image rendering operations of image source assembly 682, such as the operations of light source 692 and/or projector 696. For example, controller 684 may determine instructions for image source assembly 682 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 682 to generate image light. The scanning instructions may specify, for example, a type of a source of image light (e.g., monochromatic or polychromatic), a scanning rate, an orientation of a scanning apparatus, one or more illumination parameters, or any combination thereof. Controller 684 may include a combination of hardware, software, and/or firmware not shown here so as not to obscure other aspects of the present disclosure.

In some embodiments, controller 684 may be a graphics processing unit (GPU) of a display device. In other embodiments, controller 684 may be other kinds of processors. The operations performed by controller 684 may include taking content for display and dividing the content into discrete sections. Controller 684 may provide to light source 692 scanning instructions that include an address corresponding to an individual source element of light source 692 and/or an electrical bias applied to the individual source element. Controller 684 may instruct light source 692 to sequentially present the discrete sections using light emitters corresponding to one or more rows of pixels in an image ultimately displayed to the user. Controller 684 may also instruct projector 696 to perform different adjustments of the light. For example, controller 684 may control projector 696 to scan the discrete sections to different areas of a coupling element of the waveguide display (e.g., waveguide display 580) as described above with respect to FIG. 4B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 686 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 686 may be one or more circuits that are dedicated to performing certain features. While image processor 686 in FIG. 5 is shown as a standalone unit that is separate from controller 684 and driver circuit 694, image processor 686 may be a sub-unit of controller 684 or driver circuit 694 in other embodiments. In other words, in those embodiments, controller 684 or driver circuit 694 may perform various image processing functions of image processor 686. Image processor 686 may also be referred to as an image processing circuit.

In the example shown in FIG. 5, light source 692 may be driven by driver circuit 694, based on data or instructions (e.g., display and scanning instructions) sent from controller 684 or image processor 686. In one embodiment, driver circuit 694 may include a circuit panel that connects to and mechanically holds various light emitters of light source 692. Light source 692 may emit light in accordance with one or more illumination parameters that are set by the controller 684 and potentially adjusted by image processor 686 and driver circuit 694. An illumination parameter may be used by light source 692 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 692 may include multiple beams of red light, green light, and blue light, or any combination thereof.

Projector 696 may perform a set of optical functions, such as focusing, combining, conditioning, or scanning the image light generated by light source 692. In some embodiments, projector 696 may include a combining assembly, a light conditioning assembly, or a scanning mirror assembly. Projector 696 may include one or more optical components that optically adjust and potentially re-direct the light from light source 692. One example of the adjustment of light may include conditioning the light, such as expanding, collimating, correcting for one or more optical errors (e.g., field curvature, chromatic aberration, etc.), some other adjustments of the light, or any combination thereof. The optical components of projector 696 may include, for example, lenses, mirrors, apertures, gratings, or any combination thereof.

Projector 696 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 696 includes a single scanning mirror that scans in at least two dimensions. In other embodiments, projector 696 may include a plurality of scanning mirrors that each scan in directions orthogonal to each other. Projector 696 may perform a raster scan (horizontally or vertically), a bi-resonant scan, or any combination thereof. In some embodiments, projector 696 may perform a controlled vibration along the horizontal and/or vertical directions with a specific frequency of oscillation to scan along two dimensions and generate a two-dimensional projected image of the media presented to user's eyes. In other embodiments, projector 696 may include a lens or prism that may serve similar or the same function as one or more scanning mirrors. In some embodiments, image source assembly 682 may not include a projector, where the light emitted by light source 692 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

In some examples, near-eye display system 680 may include one or more reconstituted semiconductor components such as described herein, e.g., display panel 690 may include one or more reconstituted semiconductor components such as described herein.

In some examples, one or more reconstituted semiconductor components may include μLEDs and/or μLEDs arrays. The μLEDs and/or μLEDs arrays may include emissive μLED elements stacked on display driver circuitry and may be formed using any of the techniques described herein.

In some examples, μLED arrays may comprise an array of red, green, and blue μLEDs arranged, in any suitable sub-pixel arrangement. In other examples, μLED arrays may include separate red, green, and blue μLED arrays that may be combined before or after projection via projection optics and/or waveguide(s). In some examples, μLED arrays may be formed via reconstitution techniques and methods, as described further below with respect to FIGS. 11-30. In some examples, stacked μLED and display driver circuits with extended interconnection area/volume may be formed using wafer reconstitution techniques, as mentioned above. In some examples, the stacked μLED and display driver circuits may be formed by reconstituting dice on a wafer prior to forming μLED emissive elements.

Figure 6A:
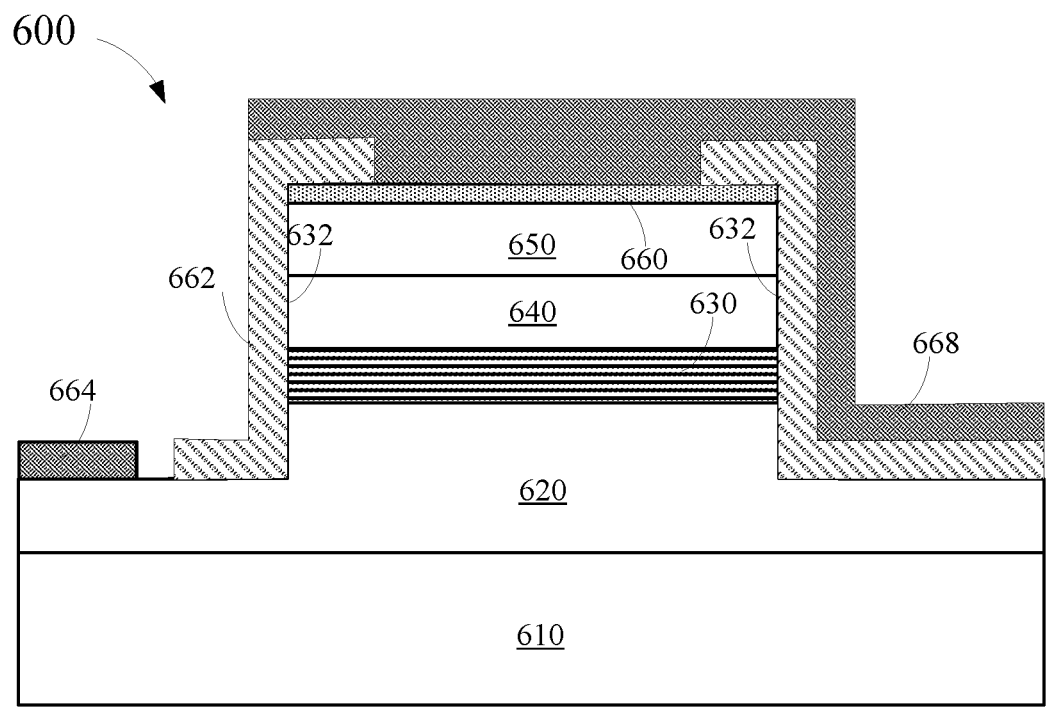
FIG. 6A illustrates an example of a light emitting diode (LED) having a vertical mesa structure according to certain embodiments.

FIG. 6A illustrates an example of an LED 600 having a vertical mesa structure. LED 600 may be a light emitter in light source 510, 540, or 692. LED 600 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-LiAlO2 structure, where the substrate may be cut in a specific direction to expose a specific plane as the growth surface.

In the example shown in FIG. 6A, LED 600 may include a substrate 610, which may include, for example, a sapphire substrate or a GaN substrate. A semiconductor layer 620 may be grown on substrate 610. Semiconductor layer 620 may include a III-V material, such as GaN, and may be p-doped (e.g., with Mg, Ca, Zn, or Be) or n-doped (e.g., with Si or Ge). One or more active layers 630 may be grown on semiconductor layer 620 to form an active region. Active layer 630 may include III-V materials, such as one or more InGaN layers, one or more AlInGaP layers, and/or one or more GaN layers, which may form one or more heterostructures, such as one or more quantum wells or MQWs. A semiconductor layer 640 may be grown on active layer 630. Semiconductor layer 640 may include a III-V material, such as GaN, and may be p-doped (e.g., with Mg, Ca, Zn, or Be) or n-doped (e.g., with Si or Ge). One of semiconductor layer 620 and semiconductor layer 640 may be a p-type layer and the other one may be an n-type layer. Semiconductor layer 620 and semiconductor layer 640 sandwich active layer 630 to form the light emitting region. For example, LED 600 may include a layer of InGaN situated between a layer of p-type GaN doped with magnesium and a layer of n-type GaN doped with silicon or oxygen. In some embodiments, LED 600 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 6A) may be grown to form a layer between active layer 630 and at least one of semiconductor layer 620 or semiconductor layer 640. The EBL may reduce the electron leakage current and improve the efficiency of the LED. In some embodiments, a heavily-doped semiconductor layer 650, such as a P+ or P++ semiconductor layer, may be formed on semiconductor layer 640 and act as a contact layer for forming an ohmic contact and reducing the contact impedance of the device. In some embodiments, a conductive layer 660 may be formed on heavily-doped semiconductor layer 650. Conductive layer 660 may include, for example, an indium tin oxide (ITO) or Al/Ni/Au film. In one example, conductive layer 660 may include a transparent ITO layer.

To make contact with semiconductor layer 620 (e.g., an n-GaN layer) and to more efficiently extract light emitted by active layer 630 from LED 600, the semiconductor material layers (including heavily-doped semiconductor layer 650, semiconductor layer 640, active layer 630, and semiconductor layer 620) may be etched to expose semiconductor layer 620 and to form a mesa structure that includes layers 620-660. The mesa structure may confine the carriers within the device. Etching the mesa structure may lead to the formation of mesa sidewalls 632 that may be orthogonal to the growth planes. A passivation layer 662 may be formed on sidewalls 632 of the mesa structure. Passivation layer 662 may include an oxide layer, such as a SiO2 layer, and may act as a reflector to reflect emitted light out of LED 600. A contact layer 664, which may include a metal layer, such as Al, Au, Ni, Ti, or any combination thereof, may be formed on semiconductor layer 620 and may act as an electrode of LED 600. In addition, another contact layer 668, such as an Al/Ni/Au metal layer, may be formed on conductive layer 660 and may act as another electrode of LED 600.

When a voltage signal is applied to contact layers 664 and 668, electrons and holes may recombine in active layer 630, where the recombination of electrons and holes may cause photon emission. The wavelength and energy of the emitted photons may depend on the energy bandgap between the valence band and the conduction band in active layer 630. For example, InGaN active layers may emit green or blue light, AlGaN active layers may emit blue to ultraviolet light, while AlInGaP active layers may emit red, orange, yellow, or green light. The emitted photons may be reflected by passivation layer 662 and may exit LED 600 from the top (e.g., conductive layer 660 and contact layer 668) or bottom (e.g., substrate 610).

In some embodiments, LED 600 may include one or more other components, such as a lens, on the light emission surface, such as substrate 610, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

In some examples, LED 600 may comprise at least a portion of one or more reconstituted semiconductor components such as described herein.

Figure 6B:
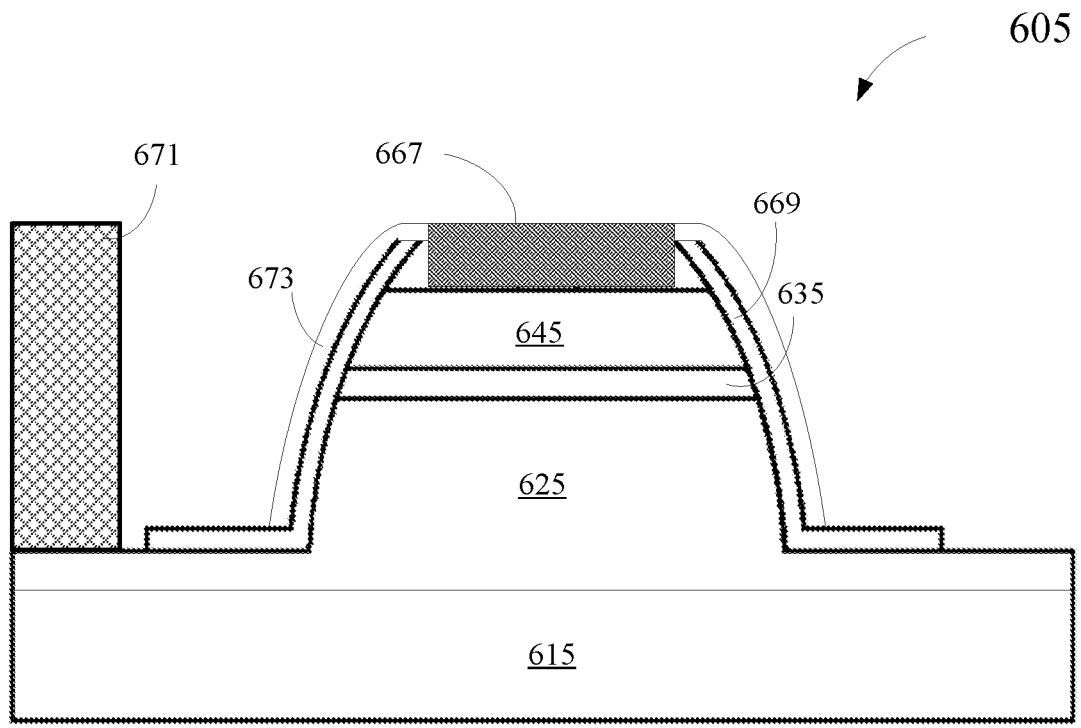
FIG. 6B is a cross-sectional view of an example of an LED having a parabolic mesa structure according to certain embodiments.

FIG. 6B is a cross-sectional view of an example of an LED 605 having a parabolic mesa structure. Similar to LED 600, LED 605 may include multiple layers of semiconductor materials, such as multiple layers of III-V semiconductor materials. The semiconductor material layers may be epitaxially grown on a substrate 615, such as a GaN substrate or a sapphire substrate. For example, a semiconductor layer 625 may be grown on substrate 615. Semiconductor layer 625 may include a III-V material, such as GaN, and may be p-doped (e.g., with Mg, Ca, Zn, or Be) or n-doped (e.g., with Si or Ge). One or more active layer 635 may be grown on semiconductor layer 625. Active layer 635 may include III-V materials, such as one or more InGaN layers, one or more AlInGaP layers, and/or one or more GaN layers, which may form one or more heterostructures, such as one or more quantum wells. A semiconductor layer 645 may be grown on active layer 635. Semiconductor layer 645 may include a III-V material, such as GaN, and may be p-doped (e.g., with Mg, Ca, Zn, or Be) or n-doped (e.g., with Si or Ge). One of semiconductor layer 625 and semiconductor layer 645 may be a p-type layer and the other one may be an n-type layer.

To make contact with semiconductor layer 625 (e.g., an n-type GaN layer) and to more efficiently extract light emitted by active layer 635 from LED 605, the semiconductor layers may be etched to expose semiconductor layer 625 and to form a mesa structure that includes layers 625-745. The mesa structure may confine carriers within the injection area of the device. Etching the mesa structure may lead to the formation of mesa side walls (also referred to herein as facets) that may be non-parallel with, or in some cases, orthogonal to the growth planes associated with crystalline growth of layers 625-645.

As shown in FIG. 6B, LED 605 may have a mesa structure that includes a flat top. A dielectric layer 669 (e.g., SiO2 or SiNx) may be formed on the facets of the mesa structure. In some embodiments, dielectric layer 669 may include multiple layers of dielectric materials. In some embodiments, a metal layer 673 may be formed on dielectric layer 669. Metal layer 673 may include one or more metal or metal alloy materials, such as aluminum (Al), silver (Ag), gold (Au), platinum (Pt), titanium (Ti), copper (Cu), or any combination thereof. Dielectric layer 669 and metal layer 673 may form a mesa reflector that can reflect light emitted by active layer 635 toward substrate 615. In some embodiments, the mesa reflector may be parabolic-shaped to act as a parabolic reflector that may at least partially collimate the emitted light.

Electrical contact 667 and electrical contact 671 may be formed on semiconductor layer 645 and semiconductor layer 625, respectively, to act as electrodes. Electrical contact 667 and electrical contact 671 may each include a conductive material, such as Al, Au, Pt, Ag, Ni, Ti, Cu, or any combination thereof (e.g., Ag/Pt/Au or Al/Ni/Au), and may act as the electrodes of LED 605. In the example shown in FIG. 6B, electrical contact 671 may be an n-contact, and electrical contact 667 may be a p-contact. Electrical contact 667 and semiconductor layer 645 (e.g., a p-type semiconductor layer) may form a back reflector for reflecting light emitted by active layer 635 back toward substrate 615. In some embodiments, electrical contact 667 and metal layer 673 include same material(s) and can be formed using the same processes. In some embodiments, an additional conductive layer (not shown) may be included as an intermediate conductive layer between the electrical contacts 667 and 671 and the semiconductor layers.

When a voltage signal is applied across contacts 667 and 671, electrons and holes may recombine in active layer 635. The recombination of electrons and holes may cause photon emission, thus producing light. The wavelength and energy of the emitted photons may depend on the energy bandgap between the valence band and the conduction band in active layer 635. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 605, for example, from the bottom side (e.g., substrate 615) shown in FIG. 6B. One or more other secondary optical components, such as a lens or a grating, may be formed on the light emission surface, such as substrate 615, to focus or collimate the emitted light and/or couple the emitted light into a waveguide.

One or two-dimensional arrays of the LEDs described above may be manufactured on a wafer to form light sources (e.g., light source 692). Driver circuits (e.g., driver circuit 694) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

In some examples, LED 605 may comprise at least a portion of one or more reconstituted semiconductor components such as described herein.

FIG. 7A illustrates an example of a method of die-to-wafer bonding for arrays of LEDs according to certain embodiments. In the example shown in FIG. 7A, an LED array 701 may include a plurality of LEDs 707 on a carrier substrate 705. Carrier substrate 705 may include various materials, such as GaAs, InP, GaN, AlN, sapphire, SiC, Si, or the like. LEDs 707 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 703 may include a base layer 709 having passive or active integrated circuits (e.g., driver circuits 711) fabricated thereon. Base layer 709 may include, for example, a silicon wafer. Driver circuits 711 may be used to control the operations of LEDs 707. For example, the driver circuit for each LED 707 may include a 2T1C pixel structure that has two transistors and one capacitor. Wafer 703 may also include a bonding layer 713. Bonding layer 713 may include various materials, such as a metal, an oxide, a dielectric, CuSn, AuTi, and the like. In some embodiments, a patterned layer 715 may be formed on a surface of bonding layer 713, where patterned layer 715 may include a metallic grid made of a conductive material, such as Cu, Ag, Au, Al, or the like.

LED array 701 may be bonded to wafer 703 via bonding layer 713 or patterned layer 715. For example, patterned layer 715 may include metal pads or bumps made of various materials, such as CuSn, AuSn, or nanoporous Au, that may be used to align LEDs 707 of LED array 701 with corresponding driver circuits 711 on wafer 703. In one example, LED array 701 may be brought toward wafer 703 until LEDs 707 come into contact with respective metal pads or bumps corresponding to driver circuits 711. Some or all of LEDs 707 may be aligned with driver circuits 711, and may then be bonded to wafer 703 via patterned layer 715 by various bonding techniques, such as metal-to-metal bonding. After LEDs 707 have been bonded to wafer 703, carrier substrate 705 may be removed from LEDs 707.

FIG. 7B illustrates an example of a method of wafer-to-wafer bonding for arrays of LEDs according to certain embodiments. As shown in FIG. 7B, a first wafer 702 may include a substrate 704, a first semiconductor layer 706, active layers 708, and a second semiconductor layer 710. Substrate 704 may include various materials, such as GaAs, InP, GaN, AlN, sapphire, SiC, Si, or the like. First semiconductor layer 706, active layers 708, and second semiconductor layer 710 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 706 may be an n-type layer, and second semiconductor layer 710 may be a p-type layer. For example, first semiconductor layer 706 may be an n-doped GaN layer (e.g., doped with Si or Ge), and second semiconductor layer 710 may be a p-doped GaN layer (e.g., doped with Mg, Ca, Zn, or Be). Active layers 708 may include, for example, one or more GaN layers, one or more InGaN layers, one or more AlInGaP layers, and the like, which may form one or more heterostructures, such as one or more quantum wells or MQWs.

In some embodiments, first wafer 702 may also include a bonding layer. Bonding layer 712 may include various materials, such as a metal, an oxide, a dielectric, CuSn, AuTi, or the like. In one example, bonding layer 712 may include p-contacts and/or n-contacts (not shown). In some embodiments, other layers may also be included on first wafer 702, such as a buffer layer between substrate 704 and first semiconductor layer 706. The buffer layer may include various materials, such as polycrystalline GaN or AlN. In some embodiments, a contact layer may be between second semiconductor layer 710 and bonding layer 712. The contact layer may include any suitable material for providing an electrical contact to second semiconductor layer 710 and/or first semiconductor layer 706.

First wafer 702 may be bonded to wafer 703 that includes driver circuits 711 and bonding layer 713 as described above, via bonding layer 713 and/or bonding layer 712. Bonding layer 712 and bonding layer 713 may be made of the same material or different materials. Bonding layer 713 and bonding layer 712 may be substantially flat. First wafer 702 may be bonded to wafer 703 by various methods, such as metal-to-metal bonding, eutectic bonding, metal oxide bonding, anodic bonding, thermo-compression bonding, ultraviolet (UV) bonding, and/or fusion bonding.

As shown in FIG. 7B, first wafer 702 may be bonded to wafer 703 with the p-side (e.g., second semiconductor layer 710) of first wafer 702 facing down (i.e., toward wafer 703). After bonding, substrate 704 may be removed from first wafer 702, and first wafer 702 may then be processed from the n-side. The processing may include, for example, the formation of certain mesa shapes for individual LEDs, as well as the formation of optical components corresponding to the individual LEDs.

In some examples, FIGS. 7A-7B may describe arrays and/or wafers that comprise at least a portion of one or more reconstituted semiconductor components such as described herein.

Figure 8A:
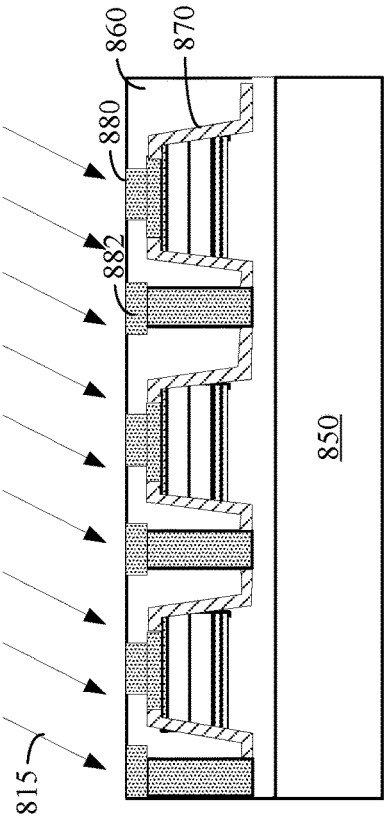
FIGS. 8A-8D illustrates an example of a method of hybrid bonding for arrays of LEDs according to certain embodiments.

FIGS. 8A-8D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 8A shows a substrate 810 with passive or active circuits 820 manufactured thereon. As described above with respect to FIGS. 7A-7B, substrate 810 may include, for example, a silicon wafer. Circuits 820 may include driver circuits for the arrays of LEDs. A bonding layer may include dielectric regions 840 and contact pads 830 connected to circuits 820 through electrical interconnects 822. Contact pads 830 may include, for example, Cu, Ag, Au, Al, W, Mo, Ni, Ti, Pt, Pd, or the like. Dielectric materials in dielectric regions 840 may include SiCN, SiO2, SiN, Al2O3, HfO2, ZrO2, Ta2O5, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 805. The activated surface may be atomically clean and may be reactive for formation of direct bonds between wafers when they are brought into contact, for example, at room temperature.

Figure 8B:
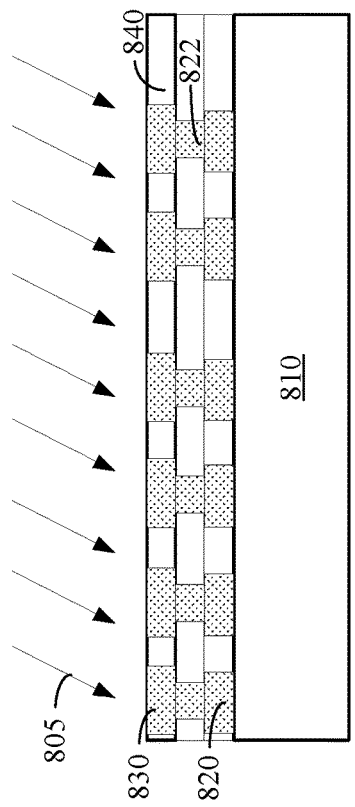

FIG. 8B illustrates a wafer 850 including an array of micro-LEDs 870 fabricated thereon as described above with respect to, for example, FIGS. 6A-7B. Wafer 850 may be a carrier wafer and may include, for example, GaAs, InP, GaN, AlN, sapphire, SiC, Si, or the like. Micro-LEDs 870 may include an n-type layer, an active region, and a p-type layer epitaxially grown on wafer 850. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 880 and n-contacts 882 may be formed in a dielectric material layer 860 deposited on the mesa structures and may make electrical contacts with the p-type layer and the n-type layers, respectively. Dielectric materials in dielectric material layer 860 may include, for example, SiCN, SiO2, SiN, Al2O3, HfO2, ZrO2, Ta2O5, or the like. P-contacts 880 and n-contacts 882 may include, for example, Cu, Ag, Au, Al, W, Mo, Ni, Ti, Pt, Pd, or the like. The top surfaces of p-contacts 880, n-contacts 882, and dielectric material layer 860 may form a bonding layer. The bonding layer may be planarized and polished using, for example, chemical mechanical polishing, where the polishing may cause dishing in p-contacts 880 and n-contacts 882. The bonding layer may then be cleaned and activated by, for example, an ion (e.g., plasma) or fast atom (e.g., Ar) beam 815. The activated surface may be atomically clean and reactive for formation of direct bonds between wafers when they are brought into contact, for example, at room temperature.

Figure 8C:
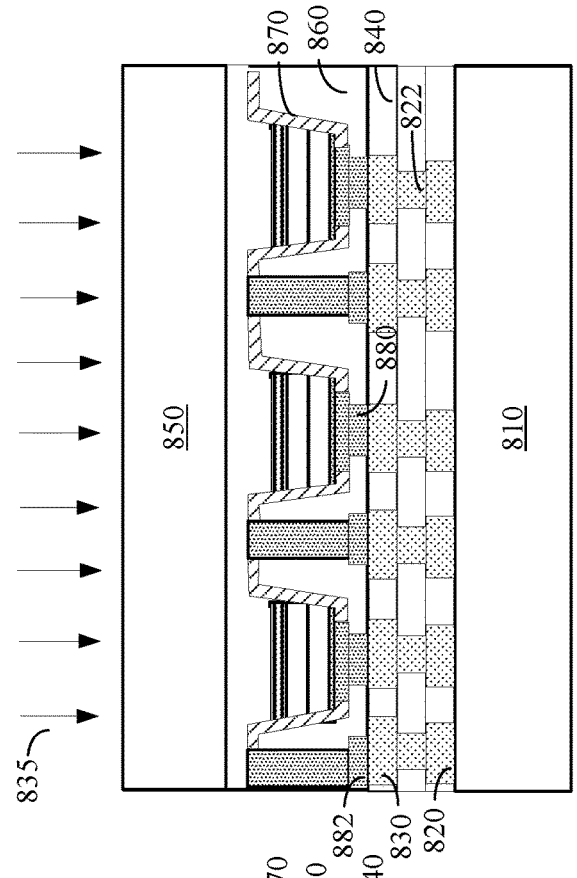

FIG. 8C illustrates a room temperature bonding process for bonding the dielectric materials in the bonding layers. For example, after the bonding layer that includes dielectric regions 840 and contact pads 830 and the bonding layer that includes p-contacts 880, n-contacts 882, and dielectric material layer 860 are surface activated, wafer 850 and micro-LEDs 870 may be turned upside down and brought into contact with substrate 810 and the circuits formed thereon. In some embodiments, compression pressure 825 may be applied to substrate 810 and wafer 850 such that the bonding layers are pressed against each other. Due to the surface activation and the dishing in the contacts, dielectric regions 840 and dielectric material layer 860 may be in direct contact because of the surface attractive force, and may react and form chemical bonds between them because the surface atoms may have dangling bonds and may be in unstable energy states after the activation. Thus, the dielectric materials in dielectric regions 840 and dielectric material layer 860 may be bonded together with or without heat treatment or pressure.

Figure 8D:
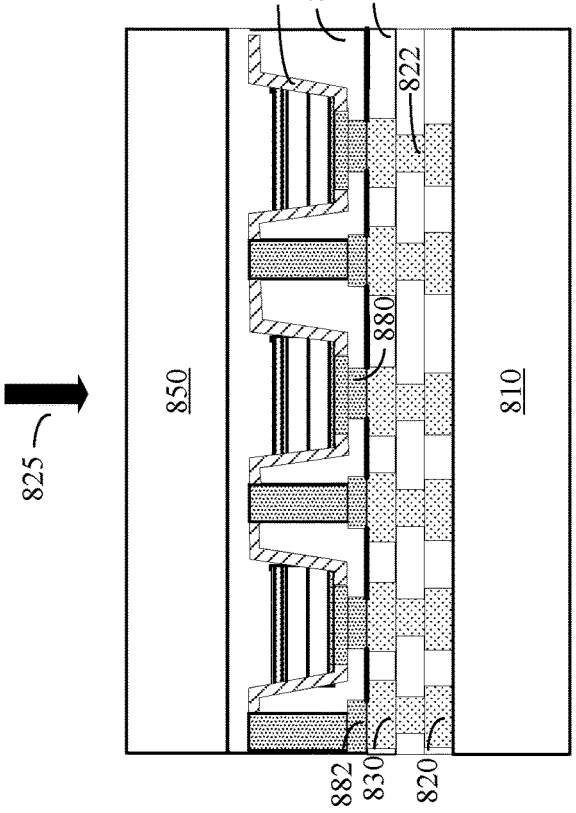

FIG. 8D illustrates an annealing process for bonding the contacts in the bonding layers after bonding the dielectric materials in the bonding layers. For example, contact pads 830 and p-contacts 880 or n-contacts 882 may be bonded together by annealing at, for example, about 200-400° C. or higher. During the annealing process, heat 835 may cause the contacts to expand more than the dielectric materials (due to different coefficients of thermal expansion), and thus may close the dishing gaps between the contacts such that contact pads 830 and p-contacts 880 or n-contacts 882 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

In some examples, FIGS. 8A-8D may describe methods that may include reconstitution of one or more semiconductor components or that may include at least a portion of one or more reconstituted semiconductor components such as described herein.

Figure 9:
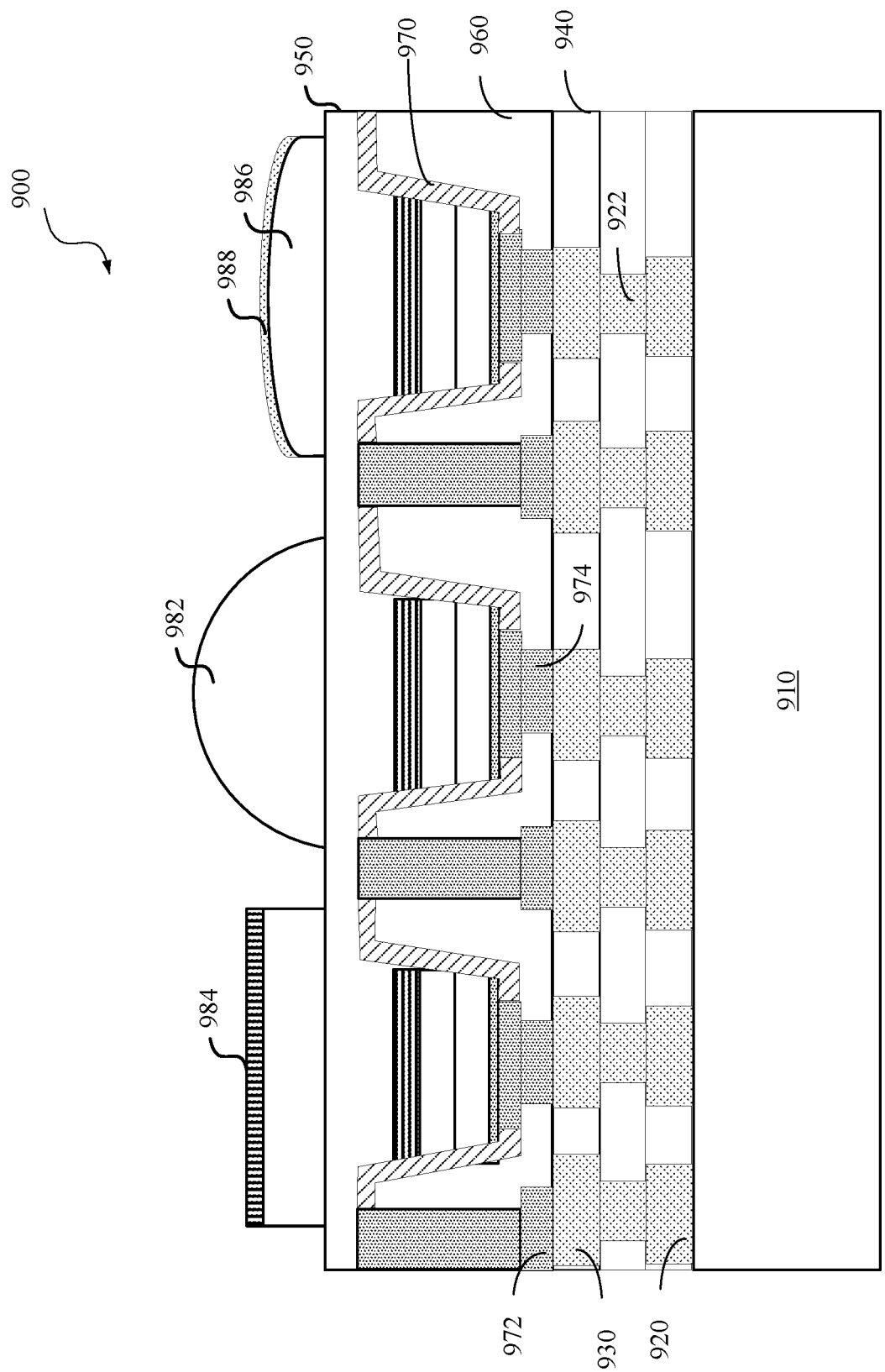
FIG. 9 illustrates an example of an LED array with secondary optical components fabricated thereon according to certain embodiments.

FIG. 9 illustrates an example of an LED array 900 with secondary optical components fabricated thereon according to certain embodiments. LED array 900 may be made by bonding an LED chip or wafer with a silicon wafer including electrical circuits fabricated thereon, using any suitable bonding techniques described above with respect to, for example, FIGS. 7A-8D. In the example shown in FIG. 9, LED array 900 may be bonded using a wafer-to-wafer hybrid bonding technique as described above with respect to FIG. 8A-8D. LED array 900 may include a substrate 910, which may be, for example, a silicon wafer. Integrated circuits 920, such as LED driver circuits, may be fabricated on substrate 910. Integrated circuits 920 may be connected to p-contacts 974 and n-contacts 972 of micro-LEDs 970 through interconnects 922 and contact pads 930, where contact pads 930 may form metallic bonds with p-contacts 974 and n-contacts 972. Dielectric layer 940 on substrate 910 may be bonded to dielectric layer 960 through fusion bonding.

The substrate (not shown) of the LED chip or wafer may be thinned or may be removed to expose the n-type layer 950 of micro-LEDs 970. Various secondary optical components, such as a spherical micro-lens 982, a grating 984, a micro-lens 986, an antireflection layer 988, and the like, may be formed in or on top of n-type layer 950. For example, spherical micro-lens arrays may be etched in the semiconductor materials of micro-LEDs 970 using a gray-scale mask and a photoresist with a linear response to exposure light, or using an etch mask formed by thermal reflowing of a patterned photoresist layer. The secondary optical components may also be etched in a dielectric layer deposited on n-type layer 950 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, SiO2, SiN, Al2O3, HfO2, ZrO2, Ta2O5, or the like. In some embodiments, a micro-LED 970 may have multiple corresponding secondary optical components, such as a micro-lens and an antireflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 9 to show some examples of secondary optical components that can be formed on micro-LEDs 970, which does not necessary imply that different secondary optical components are used simultaneously for every LED array.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

In some examples, LED array 900 may include one or more reconstituted semiconductor components such as described herein.

Figure 10:
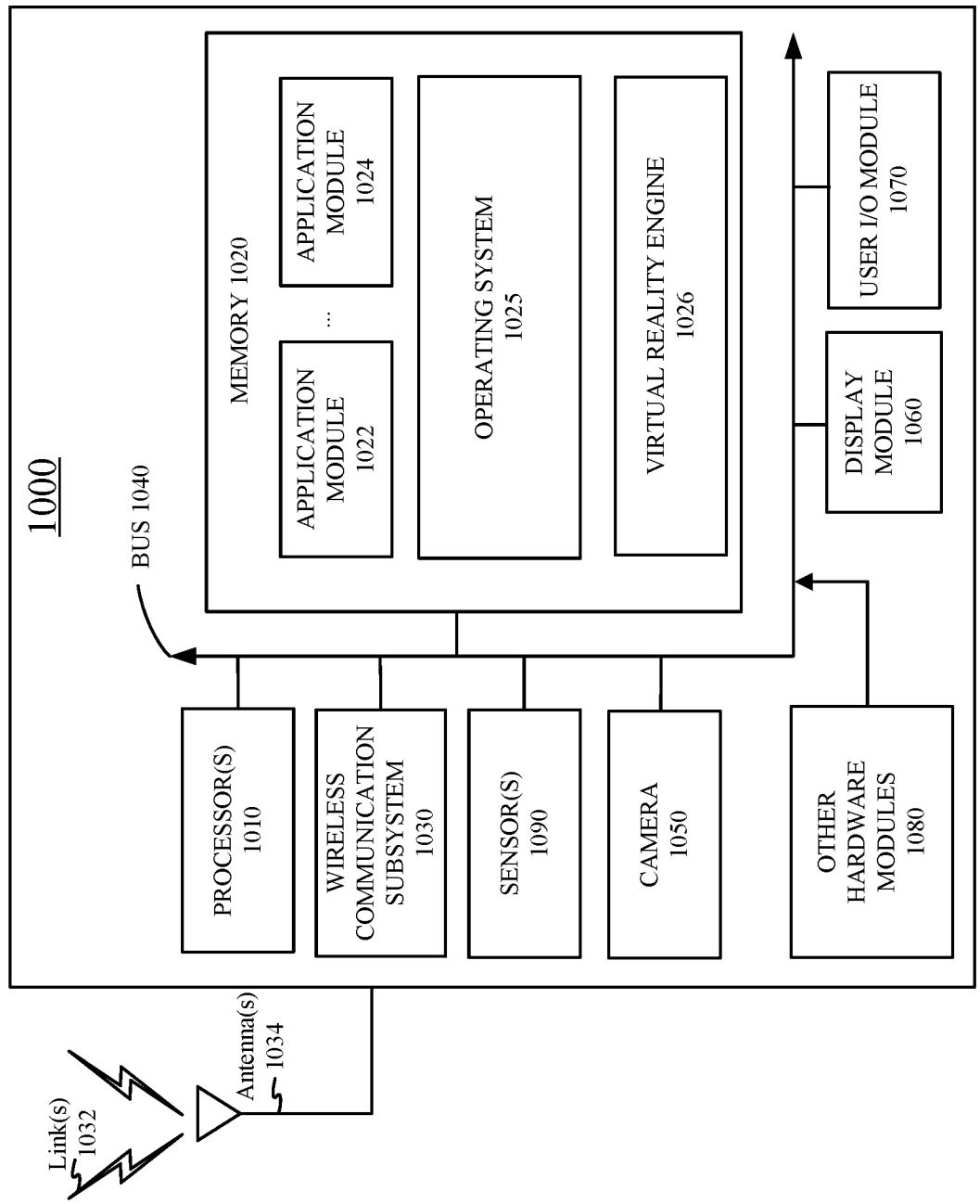
FIG. 10 is a simplified block diagram of an electronic system of an example of a near-eye display according to certain embodiments.

FIG. 10 is a simplified block diagram of an example electronic system 1000 of an example near-eye display (e.g., HMD device) for implementing some of the examples disclosed herein. Electronic system 1000 may be used as the electronic system of an HMD device or other near-eye displays described above. In this example, electronic system 1000 may include one or more processor(s) 1010 and a memory 1020. Processor(s) 1010 may be configured to execute instructions for performing operations at a number of components, and can be, for example, a general-purpose processor or microprocessor suitable for implementation within a portable electronic device. Processor(s) 1010 may be communicatively coupled with a plurality of components within electronic system 1000. To realize this communicative coupling, processor(s) 1010 may communicate with the other illustrated components across a bus 1040. Bus 1040 may be any subsystem adapted to transfer data within electronic system 1000. Bus 1040 may include a plurality of computer buses and additional circuitry to transfer data.

Memory 1020 may be coupled to processor(s) 1010. In some embodiments, memory 1020 may offer both short-term and long-term storage and may be divided into several units. Memory 1020 may be volatile, such as static random access memory (SRAM) and/or dynamic random access memory (DRAM) and/or non-volatile, such as read-only memory (ROM), flash memory, and the like. Furthermore, memory 1020 may include removable storage devices, such as secure digital (SD) cards. Memory 1020 may provide storage of computer-readable instructions, data structures, program modules, and other data for electronic system 1000. In some embodiments, memory 1020 may be distributed into different hardware modules. A set of instructions and/or code might be stored on memory 1020. The instructions might take the form of executable code that may be executable by electronic system 1000, and/or might take the form of source and/or installable code, which, upon compilation and/or installation on electronic system 1000 (e.g., using any of a variety of generally available compilers, installation programs, compression/decompression utilities, etc.), may take the form of executable code.

In some embodiments, memory 1020 may store a plurality of application modules 1022 through 1024, which may include any number of applications. Examples of applications may include gaming applications, conferencing applications, video playback applications, or other suitable applications. The applications may include a depth sensing function or eye tracking function. Application modules 1022-1024 may include particular instructions to be executed by processor(s) 1010. In some embodiments, certain applications or parts of application modules 1022-1024 may be executable by other hardware modules 1080. In certain embodiments, memory 1020 may additionally include secure memory, which may include additional security controls to prevent copying or other unauthorized access to secure information.

In some embodiments, memory 1020 may include an operating system 1025 loaded therein. Operating system 1025 may be operable to initiate the execution of the instructions provided by application modules 1022-1024 and/or manage other hardware modules 1080 as well as interfaces with a wireless communication subsystem 1030 which may include one or more wireless transceivers. Operating system 1025 may be adapted to perform other operations across the components of electronic system 1000 including threading, resource management, data storage control and other similar functionality.

Wireless communication subsystem 1030 may include, for example, an infrared communication device, a wireless communication device and/or chipset (such as a Bluetooth® device, an IEEE 2602.11 device, a Wi-Fi device, a WiMax device, cellular communication facilities, etc.), and/or similar communication interfaces. Electronic system 1000 may include one or more antennas 1034 for wireless communication as part of wireless communication subsystem 1030 or as a separate component coupled to any portion of the system. Depending on desired functionality, wireless communication subsystem 1030 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 2602.16) network. A WLAN may be, for example, an IEEE 2602.11x network. A WPAN may be, for example, a Bluetooth network, an IEEE 2602.15x, or some other types of network. The techniques described herein may also be used for any combination of WWAN, WLAN, and/or WPAN. Wireless communications subsystem 1030 may permit data to be exchanged with a network, other computer systems, and/or any other devices described herein. Wireless communication subsystem 1030 may include a means for transmitting or receiving data, such as identifiers of HMD devices, position data, a geographic map, a heat map, photos, or videos, using antenna(s) 1034 and wireless link(s) 1032. Wireless communication subsystem 1030, processor(s) 1010, and memory 1020 may together comprise at least a part of one or more of a means for performing some functions disclosed herein.

Embodiments of electronic system 1000 may also include one or more sensors 1090. Sensor(s) 1090 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1090 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 1000 may include a display module 1060. Display module 1060 may be a near-eye display, and may graphically present information, such as images, videos, and various instructions, from electronic system 1000 to a user. Such information may be derived from one or more application modules 1022-1024, virtual reality engine 1026, one or more other hardware modules 1080, a combination thereof, or any other suitable means for resolving graphical content for the user (e.g., by operating system 1025). Display module 1060 may use LCD technology, LED technology (including, for example, OLED, ILED, micro-LED, AMOLED, TOLED, etc.), light emitting polymer display (LPD) technology, or some other display technology.

Electronic system 1000 may include a user input/output module 1070. User input/output module 1070 may allow a user to send action requests to electronic system 1000. An action request may be a request to perform a particular action. For example, an action request may be to start or end an application or to perform a particular action within the application. User input/output module 1070 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1000. In some embodiments, user input/output module 1070 may provide haptic feedback to the user in accordance with instructions received from electronic system 1000. For example, the haptic feedback may be provided when an action request is received or has been performed.

Electronic system 1000 may include a camera 1050 that may be used to take photos or videos of a user, for example, for tracking the user's eye position. Camera 1050 may also be used to take photos or videos of the environment, for example, for VR, AR, or MR applications. Camera 1050 may include, for example, a complementary metal-oxide-semiconductor (CMOS) image sensor with a few millions or tens of millions of pixels. In some implementations, camera 1050 may include two or more cameras that may be used to capture 3-D images.

In some embodiments, electronic system 1000 may include a plurality of other hardware modules 1080. Each of other hardware modules 1080 may be a physical module within electronic system 1000. While each of other hardware modules 1080 may be permanently configured as a structure, some of other hardware modules 1080 may be temporarily configured to perform specific functions or temporarily activated. Examples of other hardware modules 1080 may include, for example, an audio output and/or input module (e.g., a microphone or speaker), a near field communication (NFC) module, a rechargeable battery, a battery management system, a wired/wireless battery charging system, etc.

In some embodiments, one or more functions of other hardware modules 1080 may be implemented in software.

In some embodiments, memory 1020 of electronic system 1000 may also store a virtual reality engine 1026. Virtual reality engine 1026 may execute applications within electronic system 1000 and receive position information, acceleration information, velocity information, predicted future positions, or any combination thereof of the HMD device from the various sensors. In some embodiments, the information received by virtual reality engine 1026 may be used for producing a signal (e.g., display instructions) to display module 1060. For example, if the received information indicates that the user has looked to the left, virtual reality engine 1026 may generate content for the HMD device that mirrors the user's movement in a virtual environment. Additionally, virtual reality engine 1026 may perform an action within an application in response to an action request received from user input/output module 1070 and provide feedback to the user. The provided feedback may be visual, audible, or haptic feedback. In some implementations, processor(s) 1010 may include one or more GPUs that may execute virtual reality engine 1026.

In various implementations, the above-described hardware and modules may be implemented on a single device or on multiple devices that can communicate with one another using wired or wireless connections. For example, in some implementations, some components or modules, such as GPUs, virtual reality engine 1026, and applications (e.g., tracking application), may be implemented on a console separate from the head-mounted display device. In some implementations, one console may be connected to or support more than one HMD.

In alternative configurations, different and/or additional components may be included in electronic system 1000. Similarly, functionality of one or more of the components can be distributed among the components in a manner different from the manner described above. For example, in some embodiments, electronic system 1000 may be modified to include other system environments, such as an AR system environment and/or an MR environment.

In some examples, electronic system 1000 may include one or more reconstituted semiconductor components such as described herein.

FIGS. 11-26 illustrate example semiconductor articles, which may be referred to as chiplets herein, including one or more IC dies (e.g., semiconductor dies) at least partially surrounded by a fill material and including a redistribution layer (RDL) disposed on a first co-planar surface of the one or more IC dies and the fill material, e.g., the RDL extends onto both a surface of the fill material a surface of the IC die where both the surface of the IC die and fill material are co-planar with each other. In one or more examples, the chiplets may include one or more TSV within an IC die and/or one or more TPV within the fill material, and the chiplets may include an alternative and/or additional RDL on a second co-planar surface of the one or more IC dies and the fill material opposite the first co-planar side. For example, one or more examples of FIGS. 11-26 may include example chiplets including RDL layers with extended and/or increased area for in-plane electrical interconnection points and/or pathways and increased volume for through-plane electrical interconnection points and/or pathways, e.g., TPVs.

FIG. 11A is a schematic illustration of a cross-section of an article 1100, in accordance with the techniques described in this disclosure. In some examples, article 1100 may be a semiconductor component 1100. In the example shown, article 1100 is a chiplet 1100 including a single semiconductor die 1102, alternatively referred to as IC die 1102, a fill material 1108, and a redistribution layer (RDL) 1110.

In the example shown, IC die 1102 includes bulk silicon 1104 of a certain thickness and IC layer 1107. IC layer 1107 may be a relatively thin layer that includes IC structures and components, e.g., metallization layers and/or wires, semiconductor and conductive materials separated by dielectric materials, e.g., sources, drains, gates, conductive pads, vias, and the like the comprise the integrated electronic components, e.g., transistors, capacitors, resistors, inductors, and the like, of IC die 1102. For example, IC layer 1107 may comprise a 5 micrometers (µm) thick IC layer extending within IC die 1102 from surface 1106, a 10 µm thick layer, a 20 µm thick layer, or any suitable thickness layer.

In the example shown, surface 1111 is a first major surface of chiplet 1100 and surface 1106 is a second major surface of chiplet 1100 opposite first major surface 1111. In the example shown, surface 1106 includes at least a portion of the surface of IC layer 1107, which may be referred to as the front face, top face, front surface, and or top surface of IC die 1102 and/or IC layer 1107 because that is a surface at which one or more integrated circuits (ICs) are formed within IC die 1102, e.g., within IC layer 1107. That is, surface 1106 at least partially includes the front surface of IC die 1102.

In the example shown, fill material 1108 may be an organic material or an inorganic material. For example, fill material 1108 may be an oxide or a dielectric polymer. In some examples, fill material 1108 may be a mold and/or molding compound. Fill material 1108 may be deposited, spun, or otherwise disposed in a volume adjacent to IC die 1102. The combination of IC die 1102 and fill material 1108 then may be planarized using grinding, polishing, chemical-mechanical polishing, or the like, so that the surfaces of IC die 1102 and fill material 1108 are substantially co-planar at surface 1111, e.g. along a major surface of IC die 1102 and fill material 1108 opposite surface 1106.

Surface 1111 then may be worked to thin fill material 1108. For example, surface 1111 may be thinned using grinding, polishing, chemical mechanical polishing, or the like. Surface 1111 may be thinned such that the major surfaces of IC die 1102 and fill material 1108 opposite front face 1106 of IC die 1102 are substantially co-planar.

Surface 1111 in the area of IC die 1102 may be referred to as the back face of IC die 1102, and surface 1106 in the area of IC die 1102 may be referred to as the front face of IC die 1102. In the example shown, the front face and back face of IC die 1102 are opposing surfaces which may be substantially parallel. The front and back faces of IC die 1102 may be joined by one or more perimeter walls, which may be defined by one or more surfaces that are substantially perpendicular to the front and back faces of IC die 1102. In the case of a rectangular IC die 1102, the front and back faces of IC die 1102 may be joined by four perimeter walls, each of which may have a length in the x-direction and the y-direction corresponding to the respective x-direction and y-direction lengths of the front and back faces of IC die 1102.

Fill material 1108 may surround at least a part of IC die 1102 and/or at least partially encapsulate IC die 1102. For example, fill material 1108 may contact at least one of the one or more perimeter walls of IC die 1102.

Redistribution layer (RDL) 1110 may include one or more conductors 1114 within dielectric material 1112. Conductors 1114 may form one or more conductive paths within dielectric material 1112. RDL 1110 may comprise a plurality of layers, e.g., in the thickness and/or z-direction as shown. For example, in the thickness direction, RDL 1110 may include a first dielectric layer, a first conductive layer, a second dielectric layer, a second conductive layer, and a third dielectric layer. In some examples, RDL 1110 may have more or fewer conductive and/or dielectric layers. Each of the conductive layers may have a pattern, e.g., the first conductive layer may include a plurality of conductive lanes/rows/wires and the like, or any other type of pattern. The second conductive layer may include a plurality of conductive lanes/columns/wires and the like in a direction perpendicular to the first conductive layer, or at any other angle, or may include any other type of pattern. In some examples, the dielectric layers may include vias which may include conductive material electrically interconnecting one or more conductors and/or conductive features in the first conductive layer with one or more conductors and/or conductive features in the second conductive layer or additional conductive layers. The topmost and bottom-most layers, e.g., the first and third dielectric layers, may include vias including conductive material which may form one or more interconnection points and/or areas, e.g., on the top and bottom surfaces of RDL 1110.

In some examples, RDL 1110 may be disposed on a major surface of IC 1102 and fill material 1108, e.g., surface 1111. For example, RDL 1110 may comprise an extended area of interconnection points and interconnections paths by virtue of extending beyond the in-plane area of IC die 1102. In some examples, RDL 1110 may connect with one or more other electrical components (not shown) which may interconnect with IC layer 1107 of IC die 1102.

The example of FIG. 11A illustrates an x-z cross-section of chiplet 1100. Chiplet 1100 may be rectangular, having a first length in the x-direction, a second length in the y-direction, and a thickness in the z-direction as shown, although chiplet 1100 and its described components may not be illustrated to scale in general or relative to one another. For example, the relative thickness of the entire chiplet 1100 to IC layer 1107 may not be illustrated to scale relative to one another. In the example shown, fill material 1108 and RDL 1110 extend in the x-direction beyond the length of IC die 1102. Although not shown, in some examples, fill material 1108 and RDL 1110 may extend in the y-direction beyond the length of IC die 1102 in the y-direction as well, by the same proportional amount or by some other amount. In some examples, chiplet 1100 may have a rectangular shape in the x-y directions. In other examples, chiplet 1100 may have any other shape.

In the example shown, chiplet 1100 optionally includes one or more bumps 1116. Bumps 1116 may be metal interconnects either pre-formed and/or formed during bonding. In some examples, bumps 1116 may be soldering interfaces (e.g., bumps, pads or balls) such as described above and/or a bonding or patterned layer substantially similar to bonding layer 713 or patterned layer 715 of FIGS. 7A-7B described above. In the example shown, bumps 1116 are disposed on a surface of RDL 1110 opposite surface 1111. In some examples, bumps 1116 may be disposed on any or all, in any combination, of surface 1106, the surface of RDL 1110 opposite surface 1111, or surface 1111, e.g., as connection points between surface 1111 and RDL 1110.

FIG. 11B is a schematic illustration of a cross-section of an article 1150, in accordance with the techniques described in this disclosure. In some examples, article 1150 may be a semiconductor component 1150. In the example shown, article 1150 is a chiplet 1150 that may be substantially similar to chiplet 1100 of FIG. 11A, except with RDL 1110 disposed on the opposite side of chiplet 1150, e.g., on surface 1106. In some examples, RDL 1110 may be formed with one or more interconnection points that may electrically connect and/or couple to interconnection points of IC layer 1107, e.g., to one or more electrically conductive pads formed on surface 1106 of IC die 1102.

In the example shown, chiplet 1150 optionally includes one or more bumps 1116. In the example shown, bumps 1116 are disposed on a surface of RDL 1110 opposite surface 1106. In some examples, bumps 1116 may be disposed on any or all, in any combination, of surface 1111, the surface of RDL 1110 opposite surface 1106, or surface 1106, e.g., as connection points between surface 1106 and RDL 1110.

FIG. 12A is a schematic illustration of a cross-section of another example article 1200, in accordance with the techniques described in this disclosure. In some examples, article 1200 may be a semiconductor component 1200. In the example shown, article 1200 is a chiplet 1200 that may be substantially similar to chiplet 1100 of FIG. 11A, except that IC die 1102 includes one or more TSVs 1218.

A TSV 1218 may be a through-plane interconnection point and/or pathway, e.g., through IC die 1102 (e.g., at least partially through one or both of bulk silicon 1104 and IC layer 1107) from a first position in the thickness and/or z-direction to a second position in the thickness and/or z-direction. For example, a TSV 1218 may be an electrically conductive pathway from a conductive pad of IC layer 1107 to surface 1111 and/or a conductive point of RDL 1110. In the example shown, TSVs 1218 are illustrated as being between surface 1111 and an interface of IC layer 1107 representing the thickness of IC layer 1107, however, TSVs 1218 may also extend to any z-position within IC layer 1107 or to surface 1106.

A TSV 1218 may be made of any suitable electrically conductive material. In some examples, a TSV 1218 may be a metal-filled void of IC layer 1107 and/or bulk silicon 1104. For example, a TSV 1218 may be made by first creating a void within IC layer 1107 and/or bulk silicon 1104 and at least partially filling the void with a metal and/or any suitable electrically conductive material. Additional layers may be deposited (such as liner oxide) prior to the deposition of the conductive material to isolate the side walls of the void from the conductive material.

FIG. 12B is a schematic illustration of a cross-section of an article 1250, in accordance with the techniques described in this disclosure. In some examples, article 1250 may be a semiconductor component 1250. In the example shown, article 1250 is a chiplet 1250 that may be substantially similar to chiplet 1200 of FIG. 12A, except with RDL 1110 disposed on the opposite side of chiplet 1250, e.g., on surface 1106, such as described above with respect to FIG. 11B. In some examples, RDL 1110 may be formed with one or more interconnection points that may electrically connect and/or couple to interconnection points of IC layer 1107, e.g., to one or more electrically conductive pads formed on surface 1106 of IC die 1102, and/or TSVs 1218.

FIG. 13A is a schematic illustration of a cross-section of another example article 1300, in accordance with the techniques described in this disclosure. In some examples, article 1300 may be a semiconductor component 1300. In the example shown, article 1300 is a chiplet 1300 that may be substantially similar to chiplet 1100 of FIG. 11A, except that fill material 1108 includes one or more TPVs 1318.

TPVs 1318 may be substantially similar to TSVs 1218 described above, except TPVs 1318 may be formed through fill material 1108. For example, a TPV 1318 may be a through-plane interconnection point and/or pathway, e.g., through fill material 1108 from a first position in the thickness and/or z-direction to a second position in the thickness and/or z-direction. For example, a TPV 1318 may be an electrically conductive pathway from a conductive point of RDL 1110 to surface 1106. In some examples, TPVs 1318 may be added to serve a thermal function (e.g., to increase the effective thermal conductivity of the chiplet 1300) and may not be electrically coupled to the RDL layers. In the example shown, TPVs 1318 are illustrated as being between surface 1111 and surface 1106, however, TPVs 1318 may also extend between any z-positions within fill material 1108.

A TPV 1318 may be made of any suitable electrically conductive material. In some examples, a TPV 1318 may be a metal-filled void of fill material 1108. For example, a TPV 1318 may be made by first creating a void within fill material 1108 and at least partially filling the void with a metal and/or any suitable electrically conductive material.

FIG. 13B is a schematic illustration of a cross-section of an article 1350, in accordance with the techniques described in this disclosure. In some examples, article 1350 may be a semiconductor component 1350. In the example shown, article 1350 is a chiplet 1350 that may be substantially similar to chiplet 1300 of FIG. 12A, except with RDL 1110 disposed on the opposite side of chiplet 1350, e.g., on surface 1106, such as described above with respect to FIG. 11B. In some examples, RDL 1110 may be formed with one or more interconnection points that may electrically connect and/or couple to interconnection points of IC layer 1107, e.g., to one or more electrically conductive pads formed on surface 1106 of IC die 1102, and/or TPVs 1318.

FIG. 14A is a schematic illustration of a cross-section of another example article 1400, in accordance with the techniques described in this disclosure. In some examples, article 1400 may be a semiconductor component 1400. In the example shown, article 1400 is a chiplet 1400 that may be substantially similar to chiplet 1100 of FIG. 11A, except that IC die 1102 includes one or more TSVs 1218, such as described above with reference to FIG. 12A, and fill material 1108 includes one or more TPVs 1318, such as described above with reference to FIG. 13A.

FIG. 14B is a schematic illustration of a cross-section of an article 1450, in accordance with the techniques described in this disclosure. In some examples, article 1450 may be a semiconductor component 1450. In the example shown, article 1450 is a chiplet 1450 that may be substantially similar to chiplet 1400 of FIG. 14A, except with RDL 1110 disposed on the opposite side of chiplet 1450, e.g., on surface 1106, such as described above with respect to FIG. 11B. In some examples, RDL 1110 may be formed with one or more interconnection points that may electrically connect and/or couple to interconnection points of IC layer 1107, e.g., to one or more electrically conductive pads formed on surface 1106 of IC die 1102, and/or any of TSVs 1218 and TPVs 1318.

FIG. 15 is a schematic illustration of a cross-section of another example article 1500, in accordance with the techniques described in this disclosure. In some examples, article 1500 may be a semiconductor component 1500. In the example shown, article 1500 is a chiplet 1500 that may be substantially similar to chiplet 1400 of FIG. 14A, except chiplet 1500 additionally includes RDL 1510 disposed on the opposite side of chiplet 1500, e.g., on surface 1106. RDL 1510 may be substantially similar to RDL 1110 disposed on surface 1106 of chiplet 1150, such as described above with respect to FIG. 11B. In the example shown, RDL 1510 may be formed with one or more interconnection points that may electrically connect and/or couple to interconnection points of IC layer 1107, e.g., to one or more electrically conductive pads formed on surface 1106 of IC die 1102, and/or any of TSVs 1218 and TPVs 1318. In the example shown, RDL 1110 may be formed with one or more interconnection points that may electrically connect and/or couple to interconnections points of TSVs 1218 and/or TPVs 1318. In some examples, chiplet 1500 may include only TSVs 1218 but no TPVs 1318, or only TPVs 1318 but no TSVs 1218, or any combination thereof, e.g., based on the functional and integration requirements for an application and/or use case of chiplet 1500. Also, as stated above with respect to chiplets 1300 and 1350, some or all of the TPVs 1318 of chiplet 1500 may be added for thermal functionality, e.g., thermal conductivity, and may not be electrically coupled with RDL layers.

In the examples described above with respect to FIGS. 11-15, example chiplets 1100-1500 are examples of single IC die chiplets including RDL layers with extended and/or increased area for in-plane electrical interconnection points and/or pathways and increased volume for through-plane electrical interconnection points and/or pathways, e.g., TPVs.

In the examples described below with respect to FIGS. 16-20, example chiplets 1600-2000 are examples of multiple IC die chiplets including RDL layers with extended and/or increased area for in-plane electrical interconnection points and/or pathways and increased volume for through-plane electrical interconnection points and/or pathways, e.g., TPVs.

FIG. 16 is a schematic illustration of a cross-section of another example article 1600, in accordance with the techniques described in this disclosure. In some examples, article 1600 may be a semiconductor component 1600. In the example shown, article 1600 is a chiplet 1600 including a multiple semiconductor dice 1602, alternatively referred to as IC dice 1602, a fill material 1608, and a redistribution layer (RDL) 1610. In some examples, chiplet 1600 may be substantially similar to chiplet 1100 described above with respect to FIG. 11A, but with multiple IC dice.

In some examples, each of the multiple IC dice 1602 may be substantially similar to IC die 1102 described above, although IC dice 1602 may not necessarily be the same as each other, e.g., each of IC dice 1602 may be dissimilar IC dice. For example, IC dice 1602 includes bulk silicon 1604 of a certain thickness and IC layer 1607. IC layer 1607 may be a relatively thin layer that includes IC structures and components, e.g., metallization layers and/or wires, semiconductor and conductive materials separated by dielectric materials, e.g., sources, drains, gates, conductive pads, vias, and the like the comprise the integrated electronic components, e.g., transistors, capacitors, resistors, inductors, and the like, of IC dice 1602. For example, IC layer 1607 may comprise a 5 micrometers (μm) thick IC layer extending within IC dice 1602 from surface 1606, a 10 μm thick layer, a 20 μm thick layer, or any suitable thickness layer.

In the example shown, surface 1611 is a first major surface of chiplet 1600 and surface 1606 is a second major surface of chiplet 1600 opposite first major surface 1611. In the example shown, surface 1606 includes at least a portion of the surface of IC layer 1607, which may be referred to as the front face, top face, front surface, and or top surface of IC dice 1602 and/or IC layer 1607 because that is a surface at which one or more integrated circuits (ICs) are formed within IC dice 1602, e.g., within IC layer 1607. That is, surface 1606 at least partially includes the front surface of IC dice 1602.

In the example shown, fill material 1608 may be an organic material or an inorganic material. For example, fill material 1608 may be an oxide or a dielectric polymer. In some examples, fill material 1608 may be a mold and/or molding compound. Fill material 1608 may be deposited, spun, or otherwise disposed in a volume adjacent to IC dice 1602. The combination of IC dice 1602 and fill material 1608 then may be planarized using grinding, polishing, chemical-mechanical polishing, or the like, so that the surfaces of IC dice 1602 and fill material 1608 are substantially co-planar at surface 1611, e.g. along a major surface of IC dice 1602 and fill material 1608 opposite front face 1606 of IC dice 1602.

Surface 1611 then may be worked to thin fill material 1608. For example, surface 1611 may be thinned using grinding, polishing, chemical mechanical polishing, or the like. Surface 1611 may be thinned such that the major surfaces of IC dice 1602 and fill material 1608 opposite surface 1606 are substantially co-planar.

Surface 1611 in the area of IC dice 1602 may be referred to as the back face of IC dice 1602, and surface 1606 in the area of IC dice 1602 may be referred to as the front face of IC dice 1602. In the example shown, the front face and back face of IC dice 1602 are opposing surfaces which may be substantially parallel. The front and back faces of IC dice 1602 may be joined by one or more perimeter walls, which may be defined by one or more surfaces that are substantially perpendicular to the front and back faces of IC dice 1602. In the case of a rectangular IC dice 1602, the front and back faces of IC dice 1602 may be joined by four perimeter walls, each of which may have a length in the x-direction and the y-direction corresponding to the respective x-direction and y-direction lengths of the front and back faces of IC dice 1602.

Fill material 1608 may surround at least a part of IC dice 1602 and/or at least partially encapsulate IC dice 1602. For example, fill material 1608 may contact at least one of the one or more perimeter walls of IC dice 1602.

Redistribution layer (RDL) 1610 may include one or more conductors 1614 within dielectric material 1612. Conductors 1614 may form one or more conductive paths within dielectric material 1612. RDL 1610 may comprise a plurality of layers, e.g., in the thickness and/or z-direction as shown. For example, in the thickness direction, RDL 1610 may include a first dielectric layer, a first conductive layer, a second dielectric layer, a second conductive layer, and a third dielectric layer. In some examples, RDL 1610 may have more or fewer conductive and/or dielectric layers. Each of the conductive layers may have a pattern, e.g., the first conductive layer may include a plurality of conductive lanes/rows/wires and the like, or any other type of pattern. The second conductive layer may include a plurality of conductive lanes/columns/wires and the like in a direction perpendicular to the first conductive layer, or at any other angle, or may include any other type of pattern. In some examples, the dielectric layers may include vias which may include conductive material electrically interconnecting one or more conductors and/or conductive features in the first conductive layer with one or more conductors and/or conductive features in the second conductive layer. First, the topmost and bottom-most layers, e.g., the first and third dielectric layers, may include vias including conductive material which may form one or more interconnection points and/or areas, e.g., on the top and bottom surfaces of RDL 1610.

In some examples, RDL 1610 may be disposed on a major surface of IC dice 1602 and fill material 1608, e.g., surface 1611. For example, RDL 1610 may comprise an extended area of interconnection points and interconnections paths by virtue of extending beyond the in-plane area of IC dice 1602. In some examples, RDL 1610 may connect with one or more other electrical components (not shown) which may interconnect with IC layer 1607 of IC dice 1602.

The example of FIG. 16A illustrates an x-z cross-section of chiplet 1600. Chiplet 1600 may be rectangular, having a first length in the x-direction, a second length in the y-direction, and a thickness in the z-direction as shown, although chiplet 1600 and its described components may not be illustrated to scale in general or relative to one another. For example, the relative thickness of the entire chiplet 1600 to IC layer 1607 may not be illustrated to scale relative to one another. In the example shown, fill material 1608 and RDL 1610 extend in the x-direction beyond the length of IC dice 1602. Although not shown, in some examples, fill material 1608 and RDL 1610 may extend in the y-direction beyond the length of IC dice 1602 in the y-direction as well, by the same proportional amount or by some other amount. In some examples, chiplet 1600 may have a rectangular shape in the x-y directions. In other examples, chiplet 1600 may have any other shape.

In the example shown, chiplet 1600 optionally includes one or more bumps 1616. Bumps 1616 may be metal interconnects used and/or formed during bonding. In some examples, bumps 1616 may be soldering interfaces (e.g., bumps, pads or balls) such as described above and/or a bonding or patterned layer substantially similar to bonding layer 713 or patterned layer 715 of FIGS. 7A-7B described above. In the example shown, bumps 1616 are disposed on a surface of RDL 1610 opposite surface 1611. In some examples, bumps 1616 may be disposed on any or all, in any combination, of surface 1606, the surface of RDL 1610 opposite surface 1611, or surface 1611, e.g., as connection points between surface 1611 and RDL 1610.

In some examples, RDL 1610 may be disposed on the opposite side of chiplet 1600, e.g., on surface 1606 rather than surface 1611, and may be substantially similar to chiplet 1150 as described above with respect to FIG. 11B except with multiple IC dice 1602. For example, RDL 1610 may be formed with one or more interconnection points that may electrically connect and/or couple to interconnection points of IC layer 1607, e.g., to one or more electrically conductive pads formed on surface 1606 of IC dice 1602. Additionally, bumps 1616 may be disposed on any or all, in any combination, of surface 1611, the surface of RDL 1610 opposite surface 1106 and/or surface a611, or surface 1106, e.g., as connection points between surface 1106 and RDL 1110.

FIG. 17 is a schematic illustration of a cross-section of another example article, in accordance with the techniques described in this disclosure. In some examples, article 1700 may be a semiconductor component 1700. In the example shown, article 1700 is a chiplet 1700 that may be substantially similar to chiplet 1600 of FIG. 16, except that IC dice 1602 includes one or more TSVs 1718. In some examples, chiplet 1600 may be substantially similar to chiplet 1200 described above with respect to FIG. 12A, but with multiple IC dice. In some examples, IC dice 1602 may not necessarily be the same as each other, e.g., each of IC dice 1602 may be dissimilar IC dice.

A TSV 1718 may be a through-plane interconnection point and/or pathway, e.g., through one or more IC dice 1602 (e.g., at least partially through one or both of bulk silicon 1604 and IC layer 1607) from a first position in the thickness and/or z-direction to a second position in the thickness and/or z-direction. For example, a TSV 1718 may be an electrically conductive pathway from a conductive pad of IC layer 1607 to surface 1611 and/or a conductive point of RDL 1610. In the example shown, TSVs 1718 are illustrated as being between surface 1611 and an interface of IC layer 1607 representing the thickness of IC layer 1607, however, TSVs 1718 may also extend to any z-position within IC layer 1607 or to surface 1606.

A TSV 1718 may be made of any suitable electrically conductive material. In some examples, a TSV 1718 may be a metal-filled void of IC layer 1607 and/or bulk silicon 1604. For example, a TSV 1718 may be made by first creating a void within IC layer 1607 and/or bulk silicon 1604 and at least partially filling the void with a metal and/or any suitable electrically conductive material. Additional layers may be deposited (such as liner oxide) prior to the deposition of the conductive material to isolate the side walls of the void from the conductive material.

In some examples, RDL 1610 may be disposed on the opposite side of chiplet 1700, e.g., on surface 1606 rather than surface 1611, and may be substantially similar to chiplet 1250 as described above with respect to FIG. 12B except with multiple IC dice 1602. For example, RDL 1610 may be formed with one or more interconnection points that may electrically connect and/or couple to interconnection points of IC layer 1607, e.g., to one or more electrically conductive pads formed on surface 1606 of IC die 1602, and/or TSVs 1718.

FIG. 18 is a schematic illustration of a cross-section of another example article 1800, in accordance with the techniques described in this disclosure. In some examples, article 1800 may be a semiconductor component 1800. In the example shown, article 1800 is a chiplet 1800 that may be substantially similar to chiplet 1600 of FIG. 16, except that fill material 1108 includes one or more TPVs 1818. In some examples, chiplet 1800 may be substantially similar to chiplet 1300 described above with respect to FIG. 13A, but with multiple IC dice. In some examples, IC dice 1602 may not necessarily be the same as each other, e.g., each of IC dice 1602 may be dissimilar IC dice.

TPVs 1818 may be substantially similar to TSVs 1718 described above, except TPVs 1818 may be formed through fill material 1608. For example, a TPV 1818 may be a through-plane interconnection point and/or pathway, e.g., through fill material 1608 from a first position in the thickness and/or z-direction to a second position in the thickness and/or z-direction. For example, a TPV 1818 may be an electrically conductive pathway from a conductive point of RDL 1610 to surface 1606. In some examples, TPVs 1318 may be added to serve a thermal function (e.g., to increase the effective thermal conductivity of the chiplet 1800) and may not be electrically coupled to the RDL layers. In the example shown, TPVs 1818 are illustrated as being between surface 1611 and surface 1606, however, TPVs 1818 may also extend between any z-positions within fill material 1608.

A TPV 1818 may be made of any suitable electrically conductive material. In some examples, a TPV 1818 may be a metal-filled void of fill material 1608. For example, a TPV 1818 may be made by first creating a void within fill material 1608 and at least partially filling the void with a metal and/or any suitable electrically conductive material.

In some examples, RDL 1610 may be disposed on the opposite side of chiplet 1800, e.g., on surface 1606 rather than surface 1611, and may be substantially similar to chiplet 1350 as described above with respect to FIG. 13B except with multiple IC dice 1602. For example, RDL 1610 may be formed with one or more interconnection points that may electrically connect and/or couple to interconnection points of IC layer 1607, e.g., to one or more electrically conductive pads formed on surface 1606 of IC die 1602, and/or TPVs 1618.

FIG. 19 is a schematic illustration of a cross-section of another example article 1900, in accordance with the techniques described in this disclosure. In some examples, article 1900 may be a semiconductor component 1900. In the example shown, article 1900 is a chiplet 1900 that may be substantially similar to chiplet 1600 of FIG. 16, except that IC dice 1602 includes one or more TSVs 1718, such as described above with reference to FIG. 17, and fill material 1608 includes one or more TPVs 1818, such as described above with reference to FIG. 18. In some examples, chiplet 1900 may be substantially similar to chiplet 1400 described above with respect to FIG. 14A, but with multiple IC dice. In some examples, IC dice 1602 may not necessarily be the same as each other, e.g., each of IC dice 1602 may be dissimilar IC dice.

In some examples, RDL 1610 may be disposed on the opposite side of chiplet 1900, e.g., on surface 1606 rather than surface 1611, and may be substantially similar to chiplet 1450 as described above with respect to FIG. 14B except with multiple IC dice 1602. For example, RDL 1610 may be formed with one or more interconnection points that may electrically connect and/or couple to interconnection points of IC layer 1607, e.g., to one or more electrically conductive pads formed on surface 1606 of IC die 1602, and/or any of TSVs 1718 and TPVs 1818.

FIG. 20 is a schematic illustration of a cross-section of another example article 2000, in accordance with the techniques described in this disclosure. In some examples, article 2000 may be a semiconductor component 2000. In the example shown, article 2000 is a chiplet 2000 that may be substantially similar to chiplet 1900 of FIG. 19, except chiplet 2000 additionally includes RDL 2010 disposed on the opposite side of chiplet 2000, e.g., on surface 1606. RDL 2010 may be substantially similar to RDL 1610 disposed on surface 1606 of chiplet 1600, such as described above with respect to FIG. 16. In some examples, IC dice 1602 may not necessarily be the same as each other, e.g., each of IC dice 1602 may be dissimilar IC dice.

In the example shown, RDL 2010 may be formed with one or more interconnection points that may electrically connect and/or couple to interconnection points of IC layer 1607, e.g., to one or more electrically conductive pads formed on surface 1606 of IC dice 1602, and/or any of TSVs 1718 and TPVs 1818. In the example shown, RDL 1610 may be formed with one or more interconnection points that may electrically connect and/or couple to interconnections points of TSVs 1718 and/or TPVs 1818. In some examples, chiplet 2000 may include only TSVs 1718 but no TPVs 1818, or only TPVs 1818 but no TSVs 1718, or any combination thereof, e.g., based on the functional and integration requirements for an application and/or use case of chiplet 1500. Also, as stated above with respect to chiplets 1300 and 1350, some or all of the TPVs 1818 of chiplet 1500 may be added for thermal functionality, e.g., thermal conductivity, and may not be electrically coupled with RDL layers.

In the examples described below with respect to FIGS. 21-24, example chiplets 2100-2400 are examples chiplets including RDL layers with extended and/or increased area for in-plane electrical interconnection points and/or pathways and increased volume for through-plane electrical interconnection points and/or pathways, e.g., TPVs, and also including additional components and/or variations as described below.

FIG. 21 is a schematic illustration of a cross-section of another example article 2100, in accordance with the techniques described in this disclosure. In some examples, article 2100 may be a semiconductor component 2100. In the example shown, article 2100 is a chiplet 2100 that may be substantially similar to chiplet 1500 of FIG. 15, except additionally including semiconductor die 2102 or any other semiconductor component e.g., any of chiplets 1100-2000 described above, a packaged IC, and the like. In some examples, chiplet 2100 may be substantially similar to chiplet 2000 of FIG. 20, e.g., chiplet 2100 may include a plurality of IC dice 1602.

Semiconductor die 2102 may be an IC die 2102 include integrated circuitry, e.g., IC structures and components, e.g., metallization layers and/or wires, semiconductor and conductive materials separated by dielectric materials, e.g., sources, drains, gates, conductive pads, vias, and the like the comprise the integrated electronic components, e.g., transistors, capacitors, resistors, inductors, and the like, similar to IC die 1102 and/or IC dice 1602. In the example shown, IC die 2102 comprises a dynamic random access memory IC chip, or DRAM 2102. In other examples, IC die 2102 may be any other type of memory, e.g., static random access memory (SRAM), magnetic random access memory (MRAM), phase change random access memory (PRAM), parameter random access memory, resistive random access memory (RRAM), ferroelectric random access memory (FRAM), or any other type of memory and/or semiconductor die. In some examples, IC die 2102 may be any semiconductor component, e.g., a packaged IC, any of the chiplets and/or articles described herein such as chiplets 1100-2000, 2300-2600, and the like. In some examples, IC die 2102 and IC die 1602 may not necessarily be the same as each other, e.g., each of IC die 1602 and IC die 2102 may be dissimilar IC dice.

In some examples, chiplet 2100 may simplify the routing of one or more interconnects, e.g., between one or more IC dice 1602 and DRAM 2102. For example, chiplet 2100 may include N number of interconnects between DRAM 2102 and one or more IC dice 1602, and M number of interconnects between the IC dice 1602 and other parts of a system into which chiplet 2100 may be integrated, e.g., other communication and/or power interconnects. In a typical chiplet in which DRAM is not stacked on RDL 1610 as shown, the N number of interconnects may be routed via RDL 1610 and/or out of the chiplet and through additional components, e.g., of a printed circuit board (PCB) and the like, resulting in interconnections that may be relatively long, e.g., several millimeters. By contrast, the N number of interconnects of chiplet 2100 may be routed directly between IC dice 1602 and DRAM 2102 (e.g., if RDL 1610 is not included) or through RDL 1610, which may be relatively thin. For example, the N interconnects may be routed out of the back of chiplet 2100, and the M number of interconnects may be routed out of the front of chiplet 2100. As such, the routing density of the interconnects may be reduced, the length of the interconnect pathways may be reduced, and the routing may be simplified. In some examples, chiplet 2100 may provide higher bandwidth interconnects, e.g., via reduced interconnect pathway length, complexity, and density, and may provide improved (e.g., reduced) interconnect latency, reduced parasitic capacitance, and improved signal integrity and power integrity, e.g., improved SI/PI.

FIG. 22 is a schematic illustration of a cross-section of another example article 2200, in accordance with the techniques described in this disclosure. In some examples, article 2200 may be a semiconductor component 2200. In the example shown, article 2200 is a chiplet 2200 that may be substantially similar to chiplet 2100 of FIG. 21, except additionally including semiconductor die 2202 rather than DRAM 2102. For example, semiconductor die 2202 may be a display processor and/or controller, and IC dice 1602 may be red, green, and blue micro-LED arrays integrated with IC circuitry. In some examples, IC die 2202 may be any semiconductor component, e.g., a packaged IC, any of the chiplets and/or articles described herein such as chiplets 1100-2100, 2300-2600, and the like. In some examples, IC die 2202 and IC dice 1602 may not necessarily be the same as each other, e.g., each of IC dice 1602 may be dissimilar IC dice from each other and from IC die 2202.

In the example shown, semiconductor die 2202 may be directly attached to RDL 1610, and may reduce and/or eliminate a fanout package otherwise needed to interconnect semiconductor die 2202 to IC dice 1602. Furthermore, the height of the die 2202 can be selected to be less than the stand-off height of the bumps 1616, e.g., the length of one or more of bumps 1616 in the z-direction as shown, to facilitate and/or enable vertical stacking of a semiconductor component, e.g., an IC die, another chiplet, and/or any other semiconductor component, with chiplet 2200, e.g., without physically interfering with semiconductor die 2202.

FIG. 23 is a schematic illustration of a cross-section of another example article 2300, in accordance with the techniques described in this disclosure. In some examples, article 2300 may be a semiconductor component 2300. In the example shown, article 2300 is a chiplet 2300 that may be substantially similar to chiplet 1500 of FIG. 15, except that the TSVs 1718 and TPVs 1818 of chiplet 2300 may be configured to separately route power and/or ground and I/O connections. In some examples, IC dice 1602 may not necessarily be the same as each other, e.g., each of IC dice 1602 may be dissimilar IC dice.

For example, power and/or ground may be interconnected to IC die 1602 by way of one or more TSV 1718 and/or TPV 1818. For example, power and/or ground interconnections may be routed to IC circuitry of IC die 1602 through surface 1611, e.g., out of the back of chiplet 2300, and I/O interconnections may be routed through surface 1606, e.g., out of the front of chiplet 2300. In some examples, power and/or ground interconnections may be routed through TSVs 1718 disposed towards the center of the volume of IC die 1602. In some examples, chiplet 2300 may include a plurality of IC dice 1602, with routing of power and/or ground separated from I/O interconnections as described for each of the IC dice 1602.

In some examples, chiplet 2300 may improve (e.g., reduce) latency, SI/PI, interconnection density and/or the number of I/O interconnections, and parasitic capacitance via routing of power and/or ground out of the back of chiplet 2300 thereby leaving more room for routing of I/O interconnections and pathways out of the front of chiplet 2300, e.g., which may provide shorter interconnection pathways to IC dice 1602.

In some examples, chiplet 2300 may reduce and/or eliminate planes, e.g., structures which otherwise may be used to route power and/or ground from a PCB to chiplet 2300. For example, the power and/or ground interconnection pathway of chiplet 2300, e.g., less than 1 mm directly out of the back of chiplet 2300, and may additionally reduce the number of layers of the RDL 1610 that are needed.

FIG. 24 is a schematic illustration of a cross-section of another example article 2400, in accordance with the techniques described in this disclosure. In some examples, article 2400 may be a semiconductor component 2400. In the example shown, article 2400 is a chiplet 2400 that may be substantially similar to chiplet 2000 of FIG. 20, except that one or more of IC dice 1602 may not have TSVs 1718 and one or more of IC dice 1602 may be flipped, e.g., the front face of one or more IC dice 1602 may be towards surface 1611 rather than surface 1606. In some examples, IC dice 1602 may not necessarily be the same as each other, e.g., each of IC dice 1602 may be dissimilar IC dice.

FIG. 25 is a schematic illustration of a cross-section of another example article 2500, in accordance with the techniques described in this disclosure. In some examples, article 2500 may be a semiconductor component 2500. In the example shown, article 2500 is a stacked chiplet 2500 that includes a plurality of chiplets. In the example shown, stacked chiplet 2500 includes three chiplets 1500 interconnected in a vertical format. Each chiplet 1500 may be substantially the same as chiplet 1500 of FIG. 15, and may be interconnected via respective RDL layers, e.g., by electrically connecting pads or other interconnection points on an RDL 1110 of a first chiplet 1500 to an RDL 1510 of a second chiplet 1500. Each chiplet 1500 may additionally, or alternatively, in any combination, be interconnected via RDL 1110 and/or RDL 1510 to bump 1116 interconnections, bump-to-bump connections, or any suitable interconnection. In some examples, IC dice 1102 of chiplet 2500 may not necessarily be the same as each other, e.g., each of IC dice 1102 may be dissimilar IC dice.

In some examples, each chiplet 1500 may include I/O interconnection points and/or pathways through one or both of the front face or bottom face, e.g., through surfaces 1106 and/or 1111 by way of any or all of RDL 1110, RDL 1510, TSVs 1218, and TPVs 1318. Each chiplet 1500 may be seamlessly integrated in the vertical format shown, e.g., by interconnecting one or more interconnects at the front face of a first chiplet 1500 to one or more interconnects at the back face of a second chiplet 1500.

In some examples, stacked chiplet 2500 may be a stack that includes and/or omits components of chiplet 1500. For example, stacked chiplet 2500 may not include bumps, and each of the component chiplets may be interconnected via RDL layers. In some examples, stacked chiplet 2500 may be formed of any combination of chiplets 1100-1500 described above.

FIG. 26 is a schematic illustration of a cross-section of another example article 2600, in accordance with the techniques described in this disclosure. In some examples, article 2600 may be a semiconductor component 2600. In the example shown, article 2600 is a stacked chiplet 2600 that includes a plurality of chiplets that each include multiple IC dice. In the example shown, stacked chiplet 2600 includes three chiplets 2000. Stacked chiplet 2000 may be substantially the same as stacked chiplet 2500 of FIG. 25, except that each chiplet includes a plurality of IC dice. In some examples, stacked chiplet 2600 may be formed of any combination of chiplets 1600-2000 described above, and may be interconnected as described above with reference to FIG. 25. In some examples, IC dice 1602 of chiplet 2600 may not necessarily be the same as each other, e.g., each of IC dice 1602 may be dissimilar IC dice.

Figure 27:
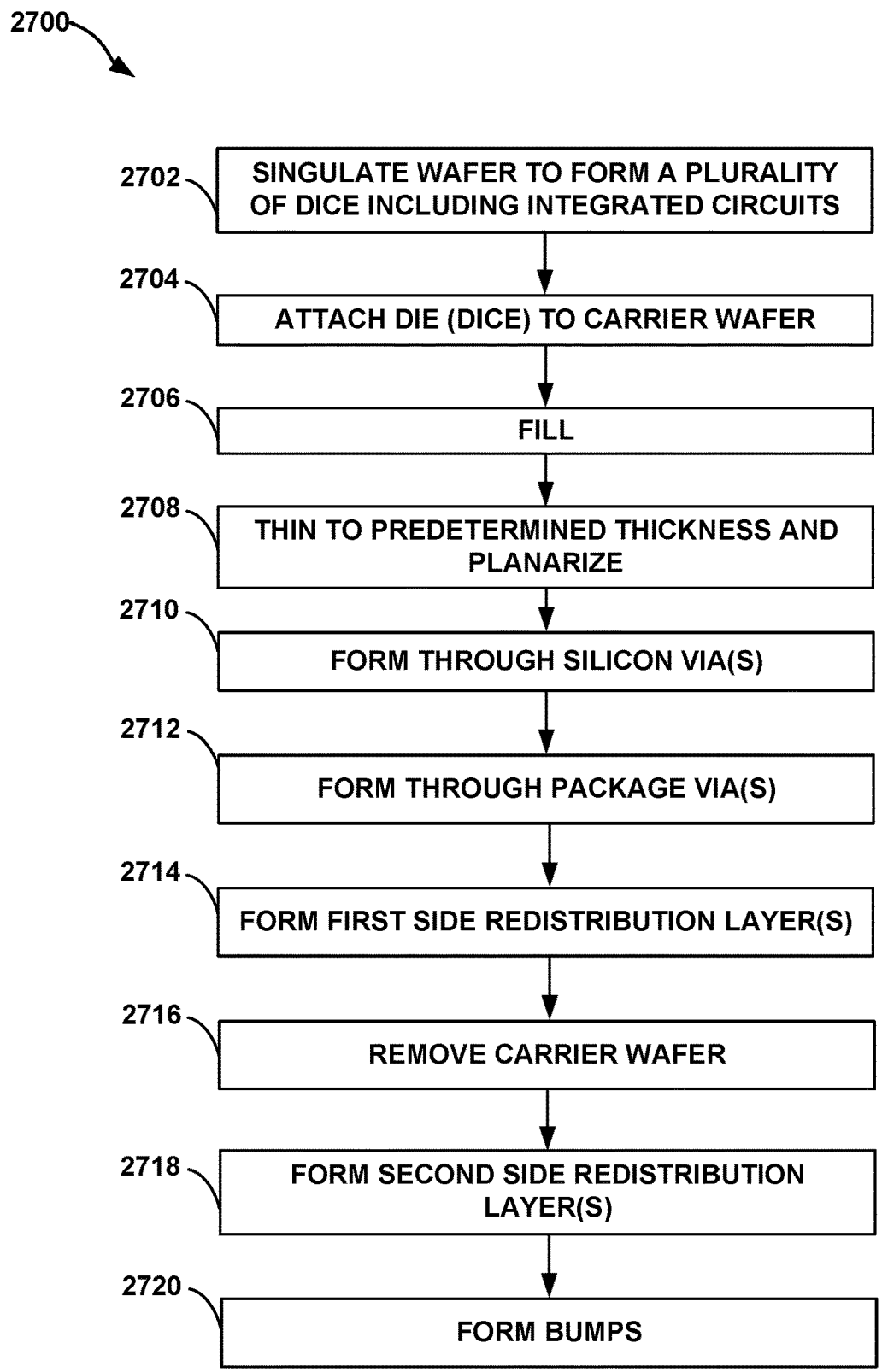
FIG. 27 is a flowchart of an example method for forming a semiconductor article, in accordance with the techniques described in this disclosure.
Figure 28A:
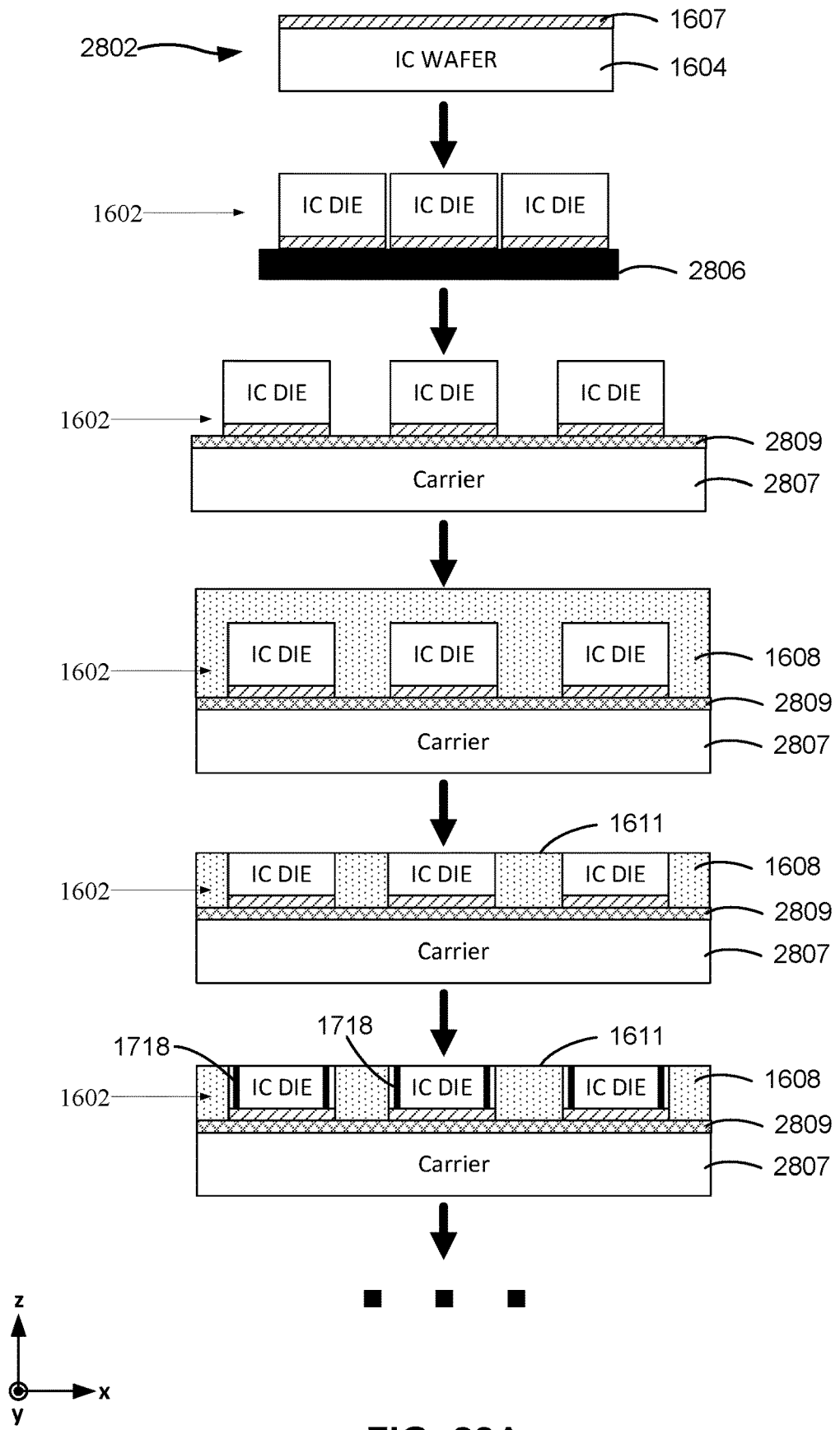
FIGS. 28A-28B are schematic illustrations of cross-sections of a wafer illustrating the method steps of FIG. 27, in accordance with the techniques described in this disclosure.
Figure 28B:
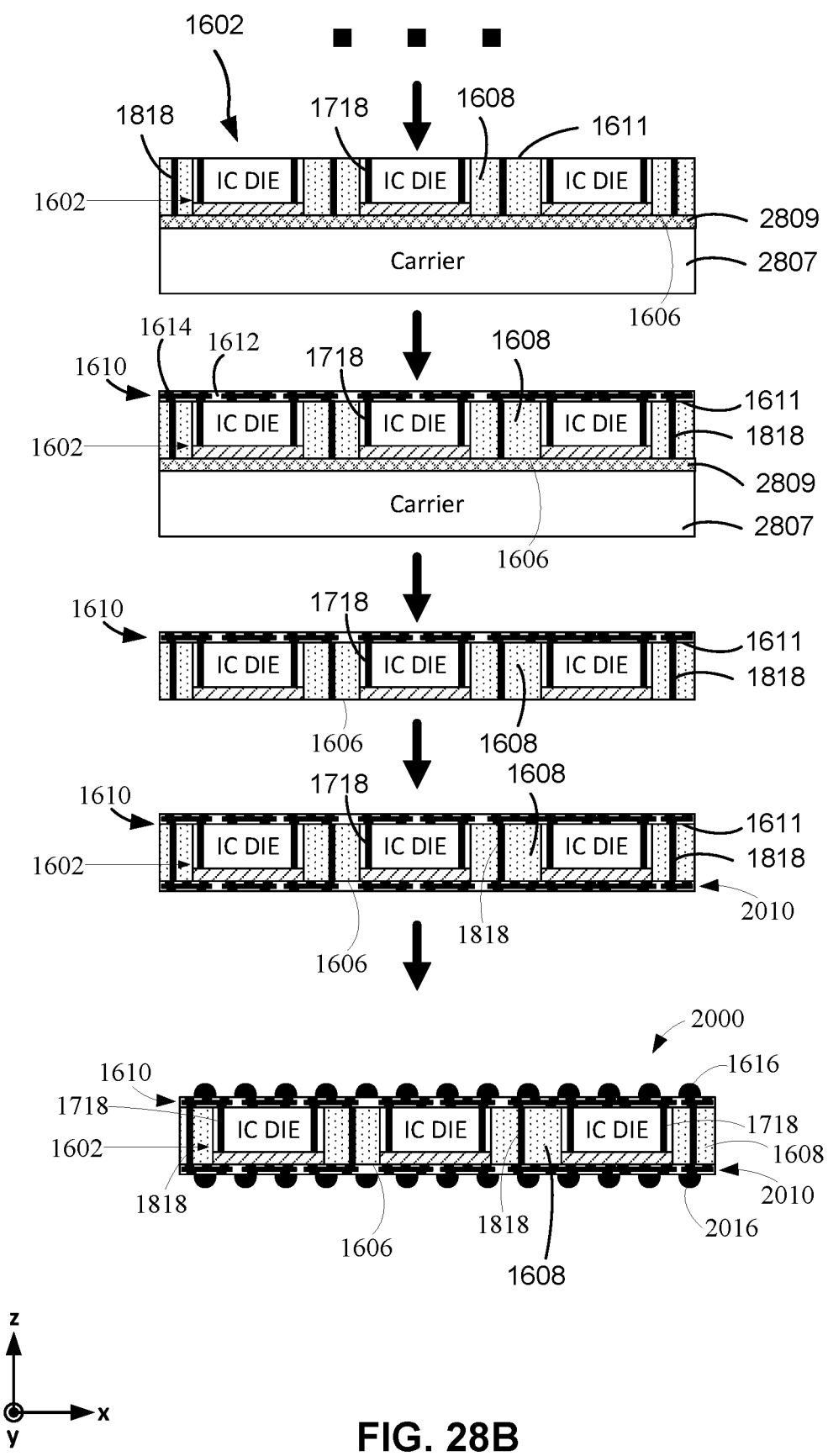

FIGS. 27 and 28A-28B illustrate an example method 2700 of forming a semiconductor article, e.g., a chiplet, and are be described concurrently. FIG. 27 is a flowchart of an example method 2700 of forming a chiplet, in accordance with the techniques described in this disclosure. FIGS. 28A-28B are schematic illustrations of one or more IC dice 1602 throughout the processing steps of FIG. 27, in accordance with the techniques described in this disclosure.

The technique of FIGS. 27 and 28A-28B includes singulating a wafer 2802 that includes a plurality of integrated circuits into a plurality of singulated dice 1602 (2702). In the example shown, wafer 2802 includes a plurality of ICs fabricated in a silicon wafer, e.g., wafer 2802 includes IC layer 1607 and bulk silicon 1604 as described above. In some examples, each IC of wafer 2802, e.g., fabricated in IC layer 1607, constitutes device driver integrated circuitry (DDIC) for communication and control of µLED arrays formed in inorganic semiconductor layers. In some examples, the integrated circuitry includes digital and analog circuitry. In some examples, wafer 2802 is a complementary metal-oxide-semiconductor (CMOS) wafer, a bi-CMOS wafer, or any other architecture including digital and/or analog circuitry for communication and control of µLEDs.

During the singulation process, wafer 2802 and the singulated dice 1602 may be supported by a frame layer 2806. For example, frame layer 2806 may be disposed on and/or attached to the front face (e.g., the IC layer 1607 side) or the back face of wafer 2802, and wafer 2802 may be singulated resulting in individual singulate dice 1602 residing on and supported by frame layer 2806.

At least one singulated die 1602 from wafer 2802 may be attached to an interim carrier 2807 (2704). In some examples, a plurality of singulated dice 1602 from wafer 2802 may be attached to interim carrier 2807, and in some examples, at least one singulated die 1602 from wafer 2802 and at least one singulated die from a different wafer potentially having different IC circuitry may be attached to interim carrier 2807 in any combination. In other words, each of singulated dice 1602 may be picked and placed on interim carrier 2807 from wafer 2802 and/or any other wafer in any order, and each of singulated dice 1602 may include the same and/or different IC circuitry from each other, e.g., each of IC dice 1602 may be dissimilar IC dice. In the example shown, singulated dice 1602 are attached "face down" via an adhesive 2809, e.g., with the IC layer 1607 attached to adhesive 2809. In some examples, interim carrier 2807 may be sized to be compatible with semiconductor processing techniques, e.g., interim carrier 2807 may have a 300 mm diameter. In some examples, interim carrier 2807 may be silicon, and in other examples interim carrier may be a material that is harder and has increased stability, e.g., dimensional and/or temperature stability, as compared to silicon. In some examples, carrier 2807 may be a material that is at least partially optically transparent, e.g., to light. In some examples, interim carrier 2807 may be a metal such as copper, or interim carrier 2807 may be glass.

In some examples, adhesive 2809 may be a relatively thin layer of adhesive, e.g., about less than 200 µm, or less than about 150 µm, or less than about 100 µm, or less than about 50 µm. In some examples, adhesive 2809 is configured to exhibit reduced deformation such as tilt and/or shift of singulated dice or die 1602 during die placement and subsequent processing, e.g., during attachment of singulated dice or die 1602 to interim carrier 2807 and/or during filling and planarizing, e.g., at (2706) below. For example, adhesive 2809 may have a thickness of less than 10 µm, e.g., for a relatively soft adhesive 2809. In other examples, adhesive 2809 may have a thickness of up to 50 µm, e.g., for a relatively rigid adhesive 2809. In some examples, adhesive 2809 may be an acrylic adhesive, such as an acrylic adhesive available under the trade designation 3M™ Liquid UV-Curable adhesive, e.g., a 3M Wafer Support System LC series adhesive. In some examples, adhesive 2809 may be a Sekisui SELFA HS tape and/or Sekisui SELFA SE tape, and the like. In still other examples, adhesive 2809 may be a Loctite® Ablestik ATB series adhesive film, or a Brewer Science BrewerBOND® series adhesive.

In some examples, the singulated dice or die 1602 may be bonded to interim wafer 2807 with spaces between adjacent dice 1602 and/or at least one side of die 1602. In some examples, IC layers 1607 may be attached to interim wafer 2807 via a face down fan-out process.

In some examples, the individual singulated dice or die 1602 may be thinned before or after singulation, e.g., after attachment to interim wafer 2807 but before final thinning and planarizing described below. For example, if semiconductor wafer 2802 has not been thinned before singulation and attachment of the singulated dice or die 1602 to interim carrier 2807, the semiconductor wafer material of the individual dice or die 1602 may be thinned from its nominal thickness, e.g., 780 μm, to a nominal thickness of about 500 μm, via mechanical grinding or polishing, or chemical mechanical grinding, similar to as described above. In some examples, thinning of the semiconductor wafer material of the individual dice may reduce bow during subsequent steps of chiplet formation.

Once singulated dice of die 1602 are attached to interim wafer 2807, a fill material 1608 may be deposited around the singulated dice or die 1602 to at least partially encapsulate singulated dice or die 1602, and/or fill a volume between adjacent singulated dice 1602, with fill material 1608 (2706). In examples including a single die 1602, fill material 1608 may be deposited to surround and/or at least partially encapsulate the singulated semiconductor die 1602. Fill material 1608 may be a polymer, or the like. In some examples, fill material 1608 may have a thickness that extends beyond singulated dice or die 1602 and may encapsulate singulated dice or die 1602. In some examples, fill material 1608 may be deposited via a molding process such as compression or transfer molding and may be a mold compound material. In some cases, fill material 1608 may be dispensed, e.g., via a nozzle and/or a liquid dispensing needle. In some examples, fill material 1608 may be configured to reduce tilt and shift of singulated dice or die 1602, e.g., during curing, thinning, planarizing, and/or subsequent TSV, TPV, and RDL formation.

Fill material 1608 and singulated dice or die 1602 then may be thinned and planarized such that a surface of fill material 1608 is substantially co-planar with a first major surface of the singulated dice or die 1602 (2708), e.g., forming co-planar surface 1611. Fill material 1608 and semiconductor dice or die 1602 may be thinned to a predetermined thickness. Fill material 1608 and semiconductor dice or die 1602 may be thinned using mechanical grinding, mechanical polishing, chemical mechanical polishing, and the like. The predetermined thickness may be, for example, about 150 micrometers. Surfaces of the singulated dice or die 1602 may be exposed after the thinning. In some examples, the exposed surfaces of the fill material 1608 may be coated with a protective layer to prevent outgassing or degradation of the fill material 1608 and/or contamination of process chambers during TSV processing and/or other downstream processing. The protective coating may become necessary especially if the fill material 1608 is an organic polymer such as a molding compound. The coating material can typically be an inorganic material such as an oxide or metal.

One or more TSVs 1718 may be formed in each singulated dice or die 1602 (2710). For example, TSVs 1718 may be formed via semiconductor processing techniques for forming TSVs. In some examples, the TSVs 1718 provide I/O connection points and or through-plane pathways to the integrated circuits, and/or μLED arrays, and/or individual μLEDs, and may be connected to one or more I/O contact points and/or pads of IC layer 1607.

One or more TPVs 1818 may be formed in fill material 1608 (2712). For example, TPVs 1818 may be formed via suitable processing techniques for forming TPVs such as post-drilling of fill material 1608 with laser or plasma, or pre-plating of metal columns prior to deposition of fill material 1608. In some examples, the TPVs 1818 provide I/O connection points and or through-plane pathways between the first and second major surfaces of chiplet 2000, e.g., back side surface 1611 and front face surface 1606. In some examples, TPVs 1818 may be connected to one or more I/O contact points and/or pads of an RDL, e.g., RDL 1610 and/or 2010.

In some examples, TSV and/or TPV formation is optional, and the chiplet may be formed with only an RDL layer, e.g., analogous to chiplets 1100, 1150, and 1600 described above.

RDL 1610 may be formed on a first major surface of the singulated dice or die 1602 and fill material 1608, e.g., co-planar surface 1611 in the example shown in FIG. 28B (2714). In the example shown, RDL 1610 includes one or more conductors 1614 within dielectric material 1612. Conductors 1614 may form one or more conductive paths within dielectric material 1612. RDL 1610 may comprise a plurality of layers, e.g., in the thickness and/or z-direction as shown. For example, in the thickness direction, RDL 1610 may include a first dielectric layer, a first conductive layer, a second dielectric layer, a second conductive layer, and a third dielectric layer. In some examples, RDL 1610 may have more or fewer conductive and/or dielectric layers. Each of the conductive layers may have a pattern, e.g., the first conductive layer may include a plurality of conductive lanes/rows/wires and the like, or any other type of pattern. The second conductive layer may include a plurality of conductive lanes/columns/wires and the like in a direction perpendicular to the first conductive layer, or at any other angle, or may include any other type of pattern. In some examples, the dielectric layers may include vias which may include conductive material electrically interconnecting one or more conductors and/or conductive features in the first conductive layer with one or more conductors and/or conductive features in the second conductive layer. First, the topmost and bottom-most layers, e.g., the first and third dielectric layers, may include vias including conductive material which may form one or more interconnection points and/or areas, e.g., on the top and bottom surfaces of RDL 1610. In some examples, example, RDL 1610 may comprise an extended area of interconnection points and interconnections paths by virtue of extending beyond the in-plane area of IC dice 1602. In some examples, RDL 1610 may connect with one or more other electrical components (not shown) which may interconnect with IC layer 1607 of IC dice 1602.

Carrier wafer 2807 and adhesive 2806 may be removed (2716), and RDL 2010 may optionally be formed on a second major surface of the singulated dice or die 1602 and fill material 1608, e.g., co-planar surface 1606 in the example shown in FIG. 28B (2718). In some examples, RDL 2010 may be substantially similar to RDL 1610 described above, including multiple layers of patterned conductors within dielectric material.

Bumps 1616 may be optionally formed on RDL 1610 and/or bumps 2016 may be optionally formed on RDL 2010 (2720). Bumps 1616, 2016 may be metal interconnects used and/or formed during bonding. In some examples, bumps 1616, 2016 may be soldering interfaces (e.g., bumps, pads or balls) such as described above and/or a bonding or patterned layer substantially similar to bonding layer 713 or patterned layer 715 of FIGS. 7A-7B described above. In the example shown, bumps 1616 are disposed on a surface of RDL 1610 opposite first major surface 1611 and bumps 2016 are disposed on a surface of RDL 2110 opposite second major surface 1606. In some examples, bumps 1616 may be disposed on any or all, in any combination, of surface 1611, the surface of RDL 1610 opposite surface 1611, and/or the surface of RDL 1610 adjacent surface 1611, and bumps 2016 may be disposed on any or all, in any combination, surface 1606, the surface of RDL 2110 opposite surface 1606, and/or the surface of RDL 2110 adjacent surface 1606, e.g., as connection points between surface 1611 and RDL 1610 and between surface 1606 and RDL 2110.

Figure 29:
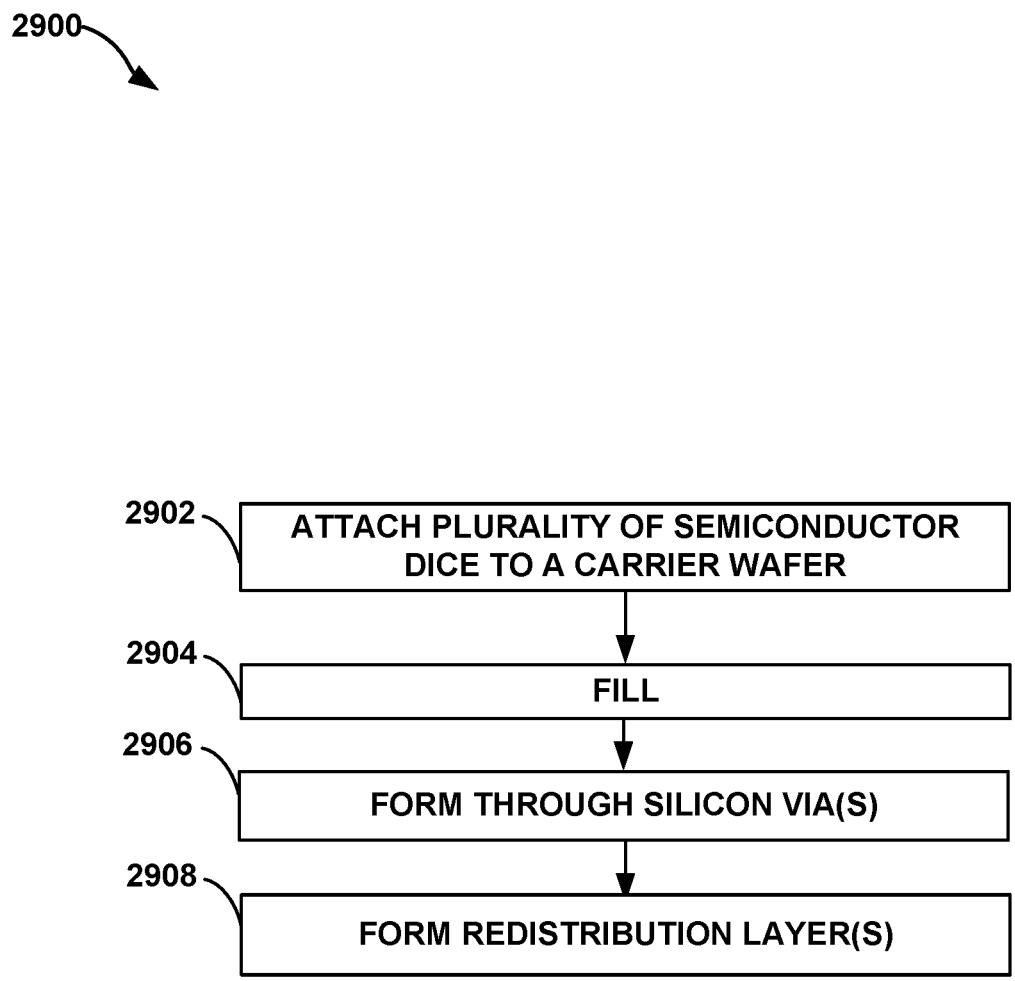
FIG. 29 is a flowchart of an example method for forming a semiconductor article, in accordance with the techniques described in this disclosure.

FIG. 29 is a flowchart of an example method 2900 for forming a semiconductor article, in accordance with the techniques described in this disclosure. In some examples, method 2900 is an example method of forming a chiplet including a plurality of semiconductor dice, and is described with reference to FIGS. 28A-28B above.

A plurality of semiconductor dice 1602 may be attached to an interim carrier 2807 (2902). In some examples, the each of the plurality semiconductor dice 1602 may be picked and placed on interim carrier 2807 from the same or different wafers in any order, and each of semiconductor dice 1602 may include the same and/or different IC circuitry from each other. In the example shown, semiconductor dice 1602 are attached "face down" via an adhesive 2809, e.g., with the IC layer 1607 attached to adhesive 2809. In some examples, interim carrier 2807 may be sized to be compatible with semiconductor processing techniques, e.g., interim carrier 2807 may have a 300 mm diameter. In some examples, interim carrier 2807 may be silicon, and in other examples interim carrier may be a material that is harder and has increased stability, e.g., dimensional and/or temperature stability, as compared to silicon. In some examples, carrier 2807 may be a material that is at least partially optically transparent, e.g., to light. In some examples, interim carrier 2807 may be a metal such as copper, or interim carrier 2807 may be glass.

In some examples, adhesive 2809 may be a relatively thin layer of adhesive, e.g., about less than 200 µm, or less than about 150 µm, or less than about 100 µm, or less than about 50 µm. In some examples, adhesive 2809 is configured to exhibit reduced deformation such as tilt and/or shift of semiconductor dice 1602 during die placement and process, e.g., during attachment of semiconductor dice 1602 to interim carrier 2807 and/or during filling and planarizing. For example, adhesive 2809 may have a thickness of less than 10 µm, e.g., for a relatively soft adhesive 2809. In other examples, adhesive 2809 may have a thickness of up to 50 µm, e.g., for a relatively rigid adhesive 2809. In some examples, adhesive 2809 may be an acrylic adhesive, such as an acrylic adhesive available under the trade designation 3M™ Liquid UV-Curable adhesive, e.g., a 3M Wafer Support System LC series adhesive. In some examples, adhesive 2809 may be a Sekisui SELFA HS tape and/or Sekisui SELFA SE tape, and the like. In still other examples, adhesive 2809 may be a Loctite® Ablestik ATB series adhesive film, or a Brewer Science BrewerBOND® series adhesive.

In some examples, the individual singulated dice or die 1602 may be thinned before or after singulation, e.g., after attachment to interim wafer 2807 but before final thinning and planarizing described below. For example, if semiconductor wafer 2802 has not been thinned before singulation and attachment of the singulated dice or die 1602 to interim carrier 2807, the semiconductor wafer material of the individual dice or die 1602 may be thinned from its nominal thickness, e.g., 780 µm, to a nominal thickness of about 500 µm, via mechanical grinding or polishing, or chemical mechanical grinding, similar to as described above. In some examples, thinning of the semiconductor wafer material of the individual dice may reduce bow during subsequent steps of chiplet formation.

In some examples, the semiconductor dice 1602 may be bonded to interim wafer 2807 with spaces between adjacent dice 1602. In some examples, IC layers 1607 may be attached to interim wafer 2807 via a face down fan-out process.

Once semiconductor dice 1602 are attached to interim wafer 2807, a fill material 1608 may be deposited between and/or around the semiconductor dice 1602 to at least partially encapsulate the plurality of semiconductor dice 1602, and/or fill a volume between adjacent semiconductor dice 1602, with fill material 1608 (2904). Fill material 1608 may be a polymer, or the like. In some examples, fill material 1608 may have a thickness that extends beyond singulated dice or die 1602 and may encapsulate singulated dice or die 1602. In some examples, fill material 1608 may be deposited via a molding process such as compression or transfer molding and may be a mold compound material. In some cases, fill material 1608 may be dispensed, e.g., via a nozzle and/or a liquid dispensing needle. In some examples, fill material 1608 may be configured to reduce tilt and shift of singulated dice or die 1602, e.g., during curing, thinning, planarizing, and/or subsequent TSV, TPV, and RDL formation.

In some examples, fill material 1608 and singulated dice or die 1602 then may be thinned and planarized such that a surface of fill material 1608 is substantially co-planar with a first major surface of the singulated dice or die 1602, e.g., forming co-planar surface 1611. Fill material 1608 and semiconductor dice or die 1602 may be thinned to a predetermined thickness. Fill material 1608 and semiconductor dice or die 1602 may be thinned using mechanical grinding, mechanical polishing, chemical mechanical polishing, and the like. The predetermined thickness may be, for example, about 150 micrometers. Surfaces of the singulated dice or die 1602 may be exposed after the thinning. In some examples, the exposed surfaces of the fill material 1608 may be coated with a protective layer to prevent outgassing or degradation of the fill material 1608 and/or contamination of process chambers during TSV processing and/or other downstream processing. The protective coating may become necessary especially if the fill material 1608 is an organic polymer such as a molding compound. The coating material can typically be an inorganic material such as an oxide or metal.

In some examples, at least one TSV 1718 extending through at least one of the plurality of semiconductor dice 1602 between the first major surface 1611 and a second major surface 1606 opposite the first major surface may optionally be formed, e.g., via semiconductor processing techniques for forming TSVs (2906). For example, the TSVs 1718 may provide I/O connection points and or through-plane pathways to the integrated circuits, and/or µLED arrays, and/or individual µLEDs, and may be connected to one or more I/O contact points and/or pads of IC layer 1607.

In some examples, at least one TPV 1818 extending through the fill material 1608 between the first major surface 1611 of the fill material and the second major surface 1606 of the fill material opposite the first major surface 1611 of the fill material may optionally be formed. For example, TPVs 1818 may be formed via suitable processing techniques for forming TPVs such as post-drilling of fill material 1608 with laser or plasma, or pre-plating of metal columns prior to deposition of fill material 1608. For example, TPVs 1818 may provide I/O connection points and or through-plane pathways between the first and second major surfaces of chiplet 2000, e.g., back side surface 1611 and front face surface 1606. In some examples, TPVs 1818 may be connected to one or more I/O contact points and/or pads of an RDL, e.g., RDL 1610 and/or 2010.

At least one RDL 1610 may be formed on a first major surface 1611 of the plurality of semiconductor dice 1602 and may extend onto a first major surface 1611 of fill material 1608, e.g., the co-planar surface 1611 in the example shown (2908). In the example shown, RDL 1610 includes one or more conductors 1614 within dielectric material 1612. Conductors 1614 may form one or more conductive paths within dielectric material 1612. RDL 1610 may comprise a plurality of layers, e.g., in the thickness and/or z-direction as shown. For example, in the thickness direction, RDL 1610 may include a first dielectric layer, a first conductive layer, a second dielectric layer, a second conductive layer, and a third dielectric layer. In some examples, RDL 1610 may have more or fewer conductive and/or dielectric layers. Each of the conductive layers may have a pattern, e.g., the first conductive layer may include a plurality of conductive lanes/rows/wires and the like, or any other type of pattern. The second conductive layer may include a plurality of conductive lanes/columns/wires and the like in a direction perpendicular to the first conductive layer, or at any other angle, or may include any other type of pattern. In some examples, the dielectric layers may include vias which may include conductive material electrically interconnecting one or more conductors and/or conductive features in the first conductive layer with one or more conductors and/or conductive features in the second conductive layer. First, the topmost and bottom-most layers, e.g., the first and third dielectric layers, may include vias including conductive material which may form one or more interconnection points and/or areas, e.g., on the top and bottom surfaces of RDL 1610. In some examples, example, RDL 1610 may comprise an extended area of interconnection points and interconnections paths by virtue of extending beyond the in-plane area of IC dice 1602. In some examples, RDL 1610 may connect with one or more other electrical components (not shown) which may interconnect with IC layer 1607 of IC dice 1602.

In some examples, at least one second RDL, e.g., RDL 2010, may be formed on the second major surface 1606 of the plurality of semiconductor dice 1602 and may extend onto the second surface 1606 of the fill material, e.g., co-planar surface 1606 in the example shown in FIG. 28B.

In some examples, a second plurality of semiconductor dice 1602 may be placed on a second carrier wafer, a second fill material may be introduced between the second plurality of semiconductor dice 1602 to at least partially encapsulate the second plurality of semiconductor dice 1602 and at least one second RDL on a first major surface of the second plurality of semiconductor dice 1602 may be formed and may extend onto a surface of the second fill material. The second carrier wafer may then be removed, and the second major surface of the first plurality of semiconductor dice 1602 may be placed on the second RDL. In other words, one or more chiplets, such as any of chiplets 1100-155 and/or chiplets 1600-2000 may be vertically stacked and interconnected to form a stacked chiplet, e.g., stacked chiplet 2500 and/or 2600. In some examples, one or more TSVs 1218 and/or 1718 may be formed in any or all of the semiconductor dice 1102 and/or 1602 of chiplets 2500 and/or 2600, and/or one or more TPVs 1318 and/or 1818 may be formed in fill material 1108 and/or 1608 of chiplets 2500 and/or 2600.

Figure 30:
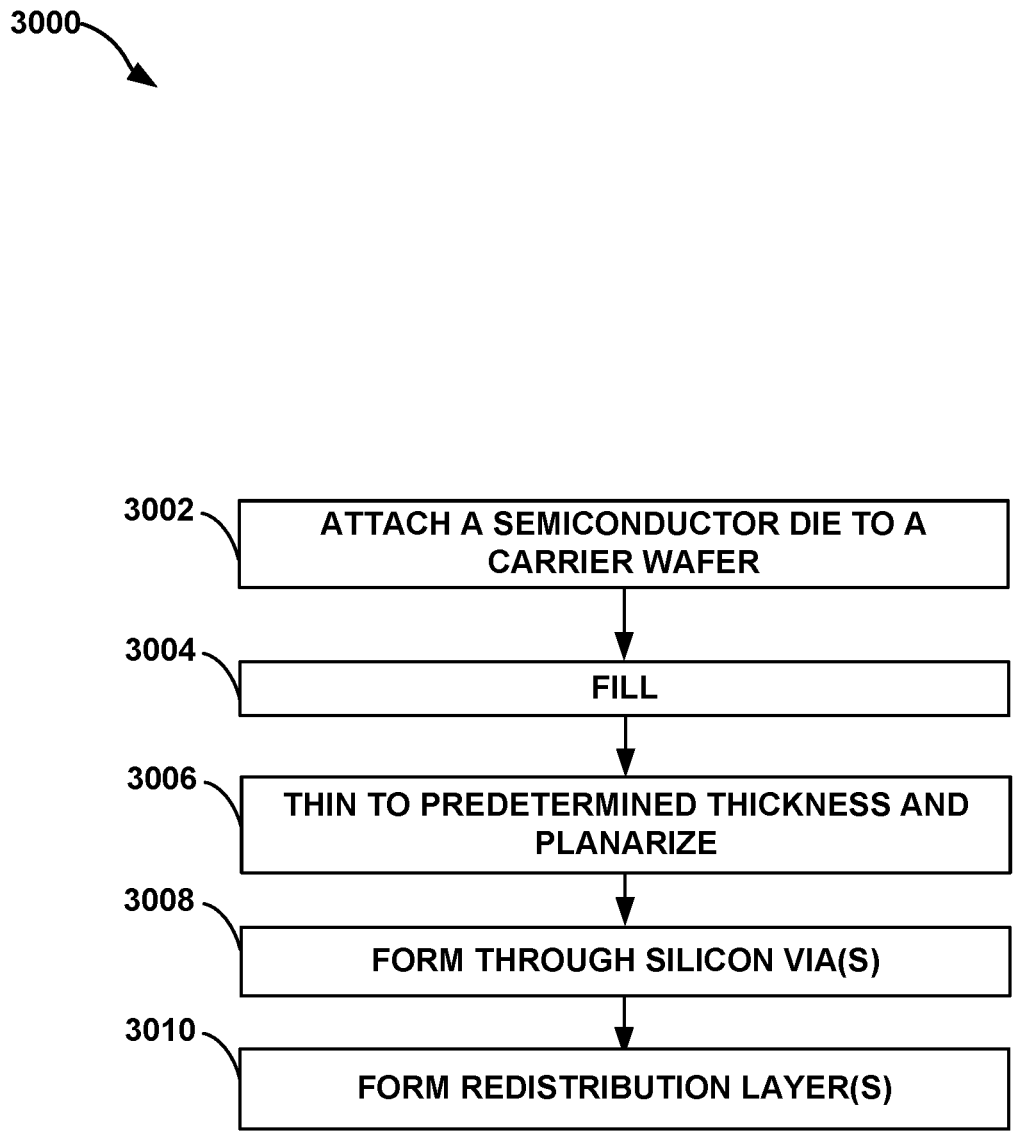
FIG. 30 is a flowchart of an example method for forming a semiconductor article, in accordance with the techniques described in this disclosure.

FIG. 30 is a flowchart of an example method 3000 for forming a semiconductor article, in accordance with the techniques described in this disclosure. In some examples, method 3000 is an example method of forming chiplet 1500 including a single semiconductor die 1102 or chiplet 2400 including one or more semiconductor dice 1602, and is described with reference to FIGS. 28A-28B above. Although method 3000 may be described as a chiplet such as chiplet 1500 including a single semiconductor die 1102, the method is described below with reference to and generally following the process steps FIGS. 28A and 28B, except that method 3000 may apply to a single semiconductor die 1102 and/or 1602 chiplet.

A single semiconductor die 1602 may be attached to an interim carrier 2807 (3002). In some examples, the semiconductor die 1602 may be picked and placed on interim carrier 2807. In the example shown, semiconductor die 1602 is attached "face down" via an adhesive 2809, e.g., with the IC layer 1607 attached to adhesive 2809. In some examples, interim carrier 2807 may be sized to be compatible with semiconductor processing techniques, e.g., interim carrier 2807 may have a 300 mm diameter. In some examples, interim carrier 2807 may be silicon, and in other examples interim carrier may be a material that is harder and has increased stability, e.g., dimensional and/or temperature stability, as compared to silicon or be transparent to light. For example, interim carrier 2807 may be a metal such as copper or glass.

In some examples, adhesive 2809 may be a relatively thin layer of adhesive, e.g., about less than 200 µm, or less than about 150 µm, or less than about 100 µm, or less than about 50 µm. In some examples, adhesive 2809 is configured to exhibit reduced deformation such as tilt and/or shift of semiconductor die 1602 during die placement and subsequent processing, e.g., during attachment of semiconductor die 1602 to interim carrier 2807 and/or during filling and planarizing. For example, adhesive 2809 may have a thickness of less than 10 µm, e.g., for a relatively soft adhesive 2809. In other examples, adhesive 2809 may have a thickness of up to 50 µm, e.g., for a relatively rigid adhesive 2809. In some examples, adhesive 2809 may be an acrylic adhesive, such as an acrylic adhesive available under the trade designation 3M™ Liquid UV-Curable adhesive, e.g., a 3M Wafer Support System LC series adhesive. In some examples, adhesive 2809 may be a Sekisui SELFA HS tape and/or Sekisui SELFA SE tape, and the like. In still other examples, adhesive 2809 may be a Loctite® Ablestik ATB series adhesive film, or a Brewer Science BrewerBOND® series adhesive.

In some examples, the individual singulated die 1602 may be thinned before or after singulation, e.g., after attachment to interim wafer 2807 but before final thinning and planarizing described below. For example, if semiconductor wafer 2802 has not been thinned before singulation and attachment of the singulated dice or die 1602 to interim carrier 2807, the semiconductor wafer material of the individual die 1602 may be thinned from its nominal thickness, e.g., 780 μm, to a nominal thickness of about 500 μm, via mechanical grinding or polishing, or chemical mechanical grinding, similar to as described above. In some examples, thinning of the semiconductor wafer material of the individual dice may reduce bow during subsequent steps of chiplet formation.

Once semiconductor die 1602 is attached to interim wafer 2807, a fill material 1608 may be deposited surrounding at least a part of semiconductor die 1602 to at least partially encapsulate the semiconductor die 1602 (3004). Fill material 1608 may be a polymer, or the like. In some examples, fill material 1608 may have a thickness that extends beyond singulated die 1602 and may encapsulate singulated die 1602. In some examples, fill material 1608 may be deposited via a molding process such as compression or transfer molding and may be a mold compound material. In some cases, fill material 1608 may be dispensed, e.g., via a nozzle and/or a liquid dispensing needle. In some examples, fill material 1608 may be configured to reduce tilt and shift of singulated dice or die 1602, e.g., during curing, thinning, planarizing, and/or subsequent TSV, TPV, and RDL formation.

Fill material 1608 and singulated die 1602 then may be thinned and planarized such that a surface of fill material 1608 is substantially co-planar with a first major surface of the semiconductor dice or die 1602 (3006), e.g., forming co-planar surface 1611. Fill material 1608 and semiconductor die 1602 may be thinned to a predetermined thickness. Fill material 1608 and semiconductor die 1602 may be thinned using mechanical grinding, mechanical polishing, chemical mechanical polishing, and the like. The predetermined thickness may be, for example, about 150 micrometers. Surfaces of the semiconductor die 1602 may be exposed after the thinning. In some examples, the exposed surfaces of the fill material 1608 may be coated with a protective layer to prevent outgassing or degradation of the fill material 1608 and/or contamination of process chambers during TSV processing and/or other downstream processing. The protective coating may become necessary especially if the fill material 1608 is an organic polymer such as a molding compound. The coating material can typically be an inorganic material such as an oxide or metal.

In some examples, at least one TSV 1718 extending through at least one of the plurality of semiconductor dice 1602 between the first major surface 1611 and a second major surface 1606 opposite the first major surface may optionally be formed, e.g., via semiconductor processing techniques for forming TSVs (3008). For example, the TSVs 1718 may provide I/O connection points and or through-plane pathways to the integrated circuits, and/or μLED arrays, and/or individual μLEDs, and may be connected to one or more I/O contact points and/or pads of IC layer 1607.

In some examples, at least one TPV 1818 extending through the fill material 1608 between the first major surface 1611 of the fill material and the second major surface 1606 of the fill material opposite the first major surface 1611 of the fill material may optionally be formed. For example, TPVs 1818 may be formed via suitable processing techniques for forming TPVs such as post-drilling of fill material 1608 with laser or plasma, or pre-plating of metal columns prior to deposition of fill material 1608. For example, TPVs 1818 may provide I/O connection points and or through-plane pathways between the first and second major surfaces of chiplet 2000, e.g., back side surface 1611 and front face surface 1606. In some examples, TPVs 1818 may be connected to one or more I/O contact points and/or pads of an RDL, e.g., RDL 1610 and/or 2010.

At least one RDL 1610 may be formed on a first major surface 1611 of semiconductor die 1602 and may extend onto a first major surface 1611 of fill material 1608, e.g., the co-planar surface 1611 in the example shown (3010). In the example shown, RDL 1610 includes one or more conductors 1614 within dielectric material 1612. Conductors 1614 may form one or more conductive paths within dielectric material 1612. RDL 1610 may comprise a plurality of layers, e.g., in the thickness and/or z-direction as shown. For example, in the thickness direction, RDL 1610 may include a first dielectric layer, a first conductive layer, a second dielectric layer, a second conductive layer, and a third dielectric layer. In some examples, RDL 1610 may have more or fewer conductive and/or dielectric layers. Each of the conductive layers may have a pattern, e.g., the first conductive layer may include a plurality of conductive lanes/rows/wires and the like, or any other type of pattern. The second conductive layer may include a plurality of conductive lanes/columns/wires and the like in a direction perpendicular to the first conductive layer, or at any other angle, or may include any other type of pattern. In some examples, the dielectric layers may include vias which may include conductive material electrically interconnecting one or more conductors and/or conductive features in the first conductive layer with one or more conductors and/or conductive features in the second conductive layer. First, the topmost and bottom-most layers, e.g., the first and third dielectric layers, may include vias including conductive material which may form one or more interconnection points and/or areas, e.g., on the top and bottom surfaces of RDL 1610. In some examples, example, RDL 1610 may comprise an extended area of interconnection points and interconnections paths by virtue of extending beyond the in-plane area of IC dice 1602. In some examples, RDL 1610 may connect with one or more other electrical components (not shown) which may interconnect with IC layer 1607 of IC dice 1602.

In some examples, at least one second RDL, e.g., RDL 2010, may be formed on the second major surface 1606 of the plurality of semiconductor dice 1602 and may extend onto the second surface 1606 of the fill material, e.g., co-planar surface 1606 in the example shown in FIG. 28B.

In some examples, a first major surface 1606 of a second semiconductor die 1602 may be placed on the interim carrier wafer 1607, e.g., the second semiconductor die 1602 may be placed face up rather than face down, e.g., per chiplet 2400 illustrated above. Fill material 1608 may be introduced between the first face down semiconductor die 1602 and the second face up semiconductor die 1602 and at least partially encapsulate both the first and second semiconductor dice 1602. The fill material 1608 may be thinned such that the surface of the fill material 1608 is substantially co-planar with a second major surface (e.g., surface of IC layer 1607) of the second semiconductor die 1602, and at least one RDL 1610 may be formed on the second major surface of the second semiconductor die 1602, fill material 1608, and first major surface of the first semiconductor die 1602.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs or videos). The artificial reality content may include video, audio, haptic feedback, or some combination thereof, and any of which may be presented in a single channel or in multiple channels (such as stereo video that produces a three-dimensional effect to the viewer). Additionally, in some examples, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

The techniques described in this disclosure may be implemented, at least in part, in hardware, software, firmware or any combination thereof. For example, various aspects of the described techniques may be implemented within one or more processors, including one or more microprocessors, DSPs, application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An article comprising:
a semiconductor die comprising integrated circuitry (IC) in an IC layer, and a bulk layer, wherein the semiconductor die defines a first major surface with the bulk layer, a second major surface with the IC layer opposite the first major surface, and a plurality of perimeter walls joining the first major surface and the second major surface;
at least one through silicon via extending through the semiconductor die between the first major surface and the second major surface and coupled to the IC layer;
a fill material surrounding at least one of the plurality of perimeter walls of the semiconductor die, wherein the fill material contacts the at least one of the plurality of perimeter walls, and wherein a first surface of the fill material is substantially co-planar with the first major surface of the semiconductor die and a second surface of the fill material is substantially co-planar with the second major surface of the semiconductor die;
at least one through package via extending through the fill material between the first surface of the fill material and the second surface of the fill material;
a first redistribution layer on the first major surface of the semiconductor die and the first surface of the fill material and including a first interconnection that connects the at least one through silicon via to a first interconnection point that is laterally offset from the at least one through silicon via and over the first major surface of the semiconductor die such that the first interconnection point is coupled to the IC layer;
a first set of bumps that are adjacent to the first redistribution layer and are contact points for electrical connection to the first redistribution layer;
a second redistribution layer on the second major surface of the semiconductor die and the second surface of the fill material and including a second interconnection that connects the at least one through package via to the IC layer and the at least one through package via is connected to a second interconnection point over the first major surface;
wherein the first interconnection point and the second interconnection point are substantially co-planar and laterally offset from the semiconductor die and both coupled to the IC layer.

2. The article of claim 1, wherein the semiconductor die is a first semiconductor die, the article further comprising:
a second semiconductor die comprising integrated circuitry in a second IC layer, and a second bulk layer, wherein the second semiconductor die defines a third major surface with the second bulk layer, a fourth major surface with the second IC layer opposite the third major surface, and a second plurality of perimeter walls joining the third major surface and the fourth major surface of the second semiconductor die,
wherein the fill material surrounds at least one of the second plurality of perimeter walls of the second semiconductor die,
wherein the fill material contacts the at least one of the second plurality of perimeter walls of the second semiconductor die, and wherein the first surface of the fill material is substantially co-planar with the third major surface of the second semiconductor die and the second surface of the fill material is substantially co-planar with the fourth major surface of the second semiconductor die, wherein the first redistribution layer is on the third major surface of the second semiconductor die and the first surface of the fill material, and wherein the second redistribution layer is on the fourth major surface of the second semiconductor die and the second surface of the fill material.

3. The article of claim 2, wherein the first semiconductor die is a digital semiconductor die, wherein the second semiconductor die is an analog semiconductor die.

4. The article of claim 2, further comprising:

a second through silicon via extending through the second semiconductor die between the third major surface and the fourth major surface and coupled to the second IC layer; and a second through package via extending through the fill material between the first surface of the fill material and the second surface of the fill material;

wherein the first redistribution layer includes a third interconnection that connects the second through silicon via to a third interconnection point, wherein the second redistribution layer includes a fourth interconnection that connects the second through package via to the second IC layer and the second through package via is connected to a fourth interconnection point over the first major surface, and wherein the third interconnection point and the fourth interconnection point are substantially co-planar and laterally offset from the second semiconductor die and both coupled to the second IC layer.

5. The article of claim 4, further comprising:

a third set of bumps adjacent to the third major surface; and a fourth set of bumps adjacent to the fourth major surface.

6. The article of claim 1, wherein the semiconductor die is a first semiconductor die, wherein the fill material is a first fill material, the article further comprising:

a second semiconductor die comprising integrated circuitry in a second IC layer, and a second bulk layer, wherein the second semiconductor die defines a third major surface with the second bulk layer, a fourth major surface with the second IC layer opposite the third major surface, and a second plurality of perimeter walls joining the third major surface and the fourth major surface of the second semiconductor die; and a second fill material surrounding at least one of the second plurality of perimeter walls of the second semiconductor die, wherein the second fill material contacts the at least one of the second plurality of perimeter walls, and wherein a third surface of the second fill material is substantially co-planar with the third major surface of the second semiconductor die and a fourth surface of the second fill material is substantially co-planar with the fourth major surface of the second semiconductor die, wherein the first redistribution layer is between the first major surface and the fourth major surface.

7. The article of claim 6, further comprising:

a third redistribution layer on the third major surface of the second semiconductor die and the third surface of the second fill material.

8. The article of claim 1, wherein the semiconductor die is a first semiconductor die, the article further comprising:

a second semiconductor die comprising integrated circuitry in a second IC layer, and a second bulk layer, wherein the second semiconductor die defines a third major surface with the second IC layer, a fourth major surface with the second bulk layer opposite the first major surface, and a second plurality of perimeter walls joining the third major surface and the fourth major surface of the second semiconductor die, wherein the fill material surrounds at least one of the second plurality of perimeter walls of the second semiconductor die, wherein the fill material contacts the at least one of the second plurality of perimeter walls of the second semiconductor die, and wherein the first surface of the fill material is substantially co-planar with the third major surface of the second semiconductor die, and wherein the first redistribution layer is on the third major surface of the second semiconductor die and the first surface of the fill material.

9. The article of claim 1, wherein the integrated circuitry comprises device driver integrated circuitry for a micro light emitting diode display.

10. The article of claim 1, further comprising a second set of bumps that are adjacent to the second redistribution layer.

11. An article comprising:

a semiconductor die comprising integrated circuitry (IC) in an IC layer, and a bulk layer, wherein the semiconductor die defines a first major surface with the bulk layer, a second major surface with the IC layer opposite the first major surface, and a plurality of perimeter walls joining the first major surface and the second major surface;

at least one through silicon via extending through the semiconductor die between the first major surface and the second major surface and coupled to the IC layer;

a fill material surrounding at least one of the plurality of perimeter walls of the semiconductor die, wherein the fill material contacts the at least one of the plurality of perimeter walls, and wherein a first surface of the fill material is substantially co-planar with the first major surface of the semiconductor die and a second surface of the fill material is substantially co-planar with the second major surface of the semiconductor die;

at least one through package via extending through the fill material between the first surface of the fill material and the second surface of the fill material;

a first redistribution layer on the first major surface of the semiconductor die and the surface of the fill material and including a first interconnection that connects the at least one through package via to a first interconnection point that is laterally offset from the at least one through package via and over the first major surface of the semiconductor die;

a second redistribution layer on the second major surface of the semiconductor die and the second surface of the fill material and including a second interconnection that connects the IC layer to a second interconnection point over the second major surface;

a first set of bumps that are adjacent the first redistribution layer and are contact points for electrical connection to the redistribution layer; and a second set of bumps that are adjacent the second redistribution layer.

12. The article of claim 11, wherein the integrated circuitry comprises device driver integrated circuitry for a micro light emitting diode display.

* * * * *